United States Patent
Yeon et al.

(10) Patent No.: US 11,399,435 B2
(45) Date of Patent: Jul. 26, 2022

(54) DEVICE COMPRISING MULTI-DIRECTIONAL ANTENNAS COUPLED THROUGH A FLEXIBLE PRINTED CIRCUIT BOARD

(71) Applicant: QUALCOMM Incorporated, San Diego, CA (US)

(72) Inventors: Jaehyun Yeon, San Diego, CA (US); Suhyung Hwang, Rancho Mission Viejo, CA (US); Rajneesh Kumar, San Diego, CA (US); Jeahyeong Han, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/093,920

(22) Filed: Nov. 10, 2020

(65) Prior Publication Data

US 2021/0345492 A1    Nov. 4, 2021

Related U.S. Application Data

(60) Provisional application No. 63/018,384, filed on Apr. 30, 2020.

(51) Int. Cl.
   *H05K 1/18* (2006.01)
   *H05K 1/02* (2006.01)

(52) U.S. Cl.
   CPC ............. *H05K 1/189* (2013.01); *H05K 1/028* (2013.01); *H05K 2201/0183* (2013.01); *H05K 2201/10098* (2013.01)

(58) Field of Classification Search
   CPC ................... H05K 1/189; H05K 1/028; H05K 2201/0183; H05K 2201/10098; H05K 3/3436; H05K 2201/046

USPC .......................................... 174/254; 361/749
See application file for complete search history.

(56) References Cited

U.S. PATENT DOCUMENTS

| | | | |
|---|---|---|---|
| 2017/0062688 A1* | 3/2017 | Zhu | F21V 29/00 |
| 2019/0027808 A1* | 1/2019 | Mow | H04R 1/025 |
| 2020/0112081 A1 | 4/2020 | Kim et al. | |
| 2020/0266519 A1* | 8/2020 | Lee | H01Q 1/2283 |

(Continued)

FOREIGN PATENT DOCUMENTS

WO    2019198870 A1    10/2019

OTHER PUBLICATIONS

International Search Report and Written Opinion—PCT/US2021/027788—ISA/EPO—dated Jul. 2, 2021.

*Primary Examiner* — Sherman Ng
(74) *Attorney, Agent, or Firm* — Loza & Loza, LLP/Qualcomm

(57) ABSTRACT

A device that includes a flexible printed circuit board (PCB), a package coupled to the flexible PCB, a first antenna device coupled to the flexible PCB, and a second antenna device coupled to the flexible PCB. The first antenna device is configured to transmit and receive a first signal having a first frequency. The second antenna device is configured to transmit and receive a second signal having a second frequency. The first antenna device may be coupled to a second surface of the flexible PCB, and the second antenna device is coupled to the second surface of the flexible PCB. The first antenna device may be coupled to a second surface of the flexible PCB, and the second antenna device is coupled to a first surface of the flexible PCB.

25 Claims, 26 Drawing Sheets

(56) References Cited

U.S. PATENT DOCUMENTS

2020/0395675 A1\* 12/2020 Han .................. H01Q 5/35
2021/0044001 A1\* 2/2021 Kang ................ H01Q 1/243

\* cited by examiner

ANTENNA DEVICE
BOTTOM PLAN VIEW

ANTENNA DEVICE
TOP PLAN VIEW

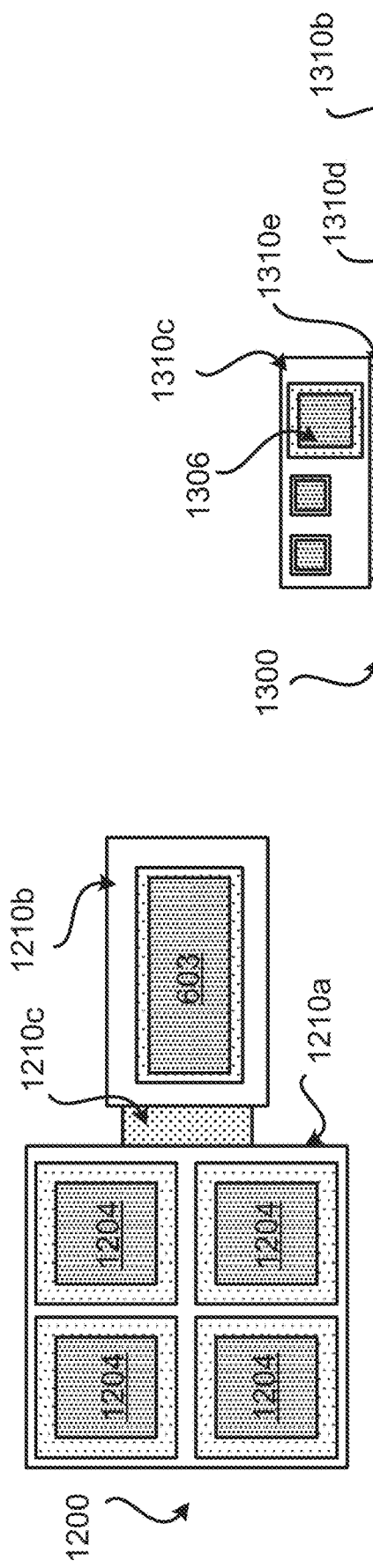
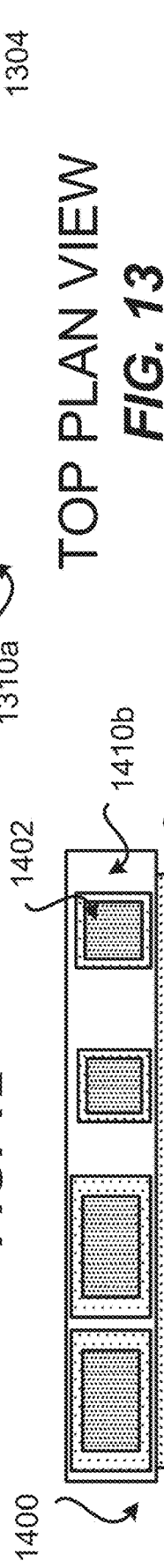
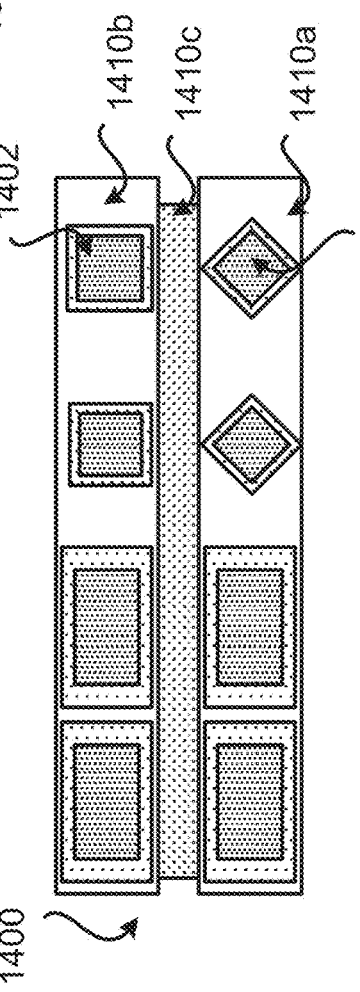
TOP PLAN VIEW
FIG. 12
TOP PLAN VIEW
FIG. 13
TOP PLAN VIEW
FIG. 14

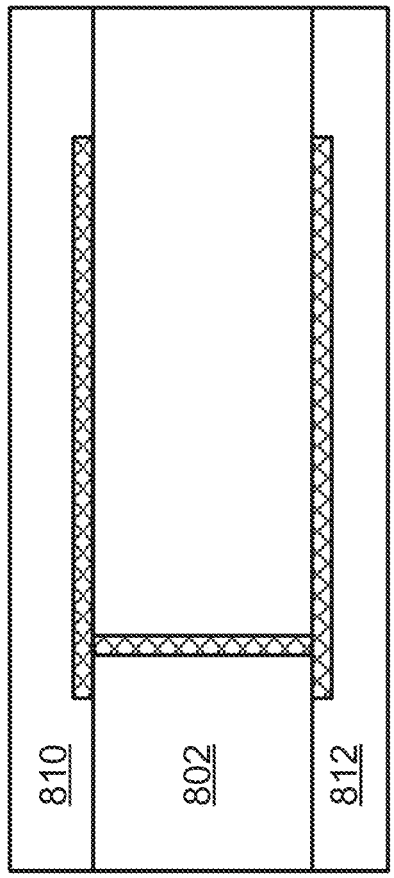
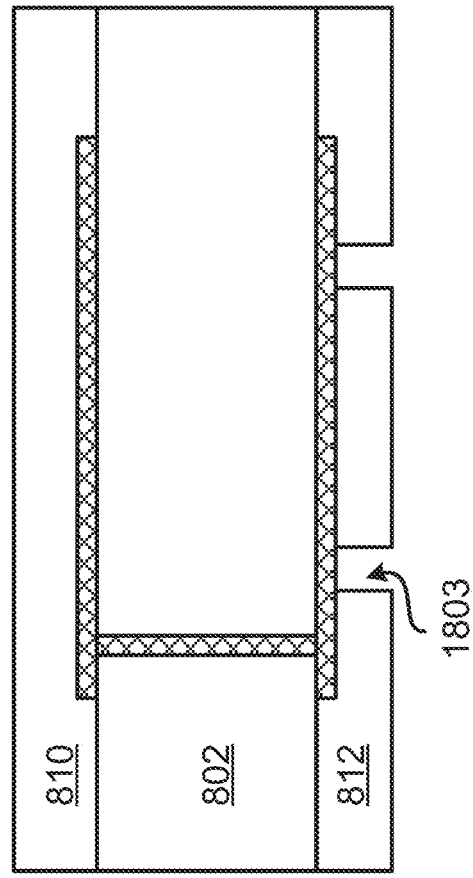
FIG. 18B

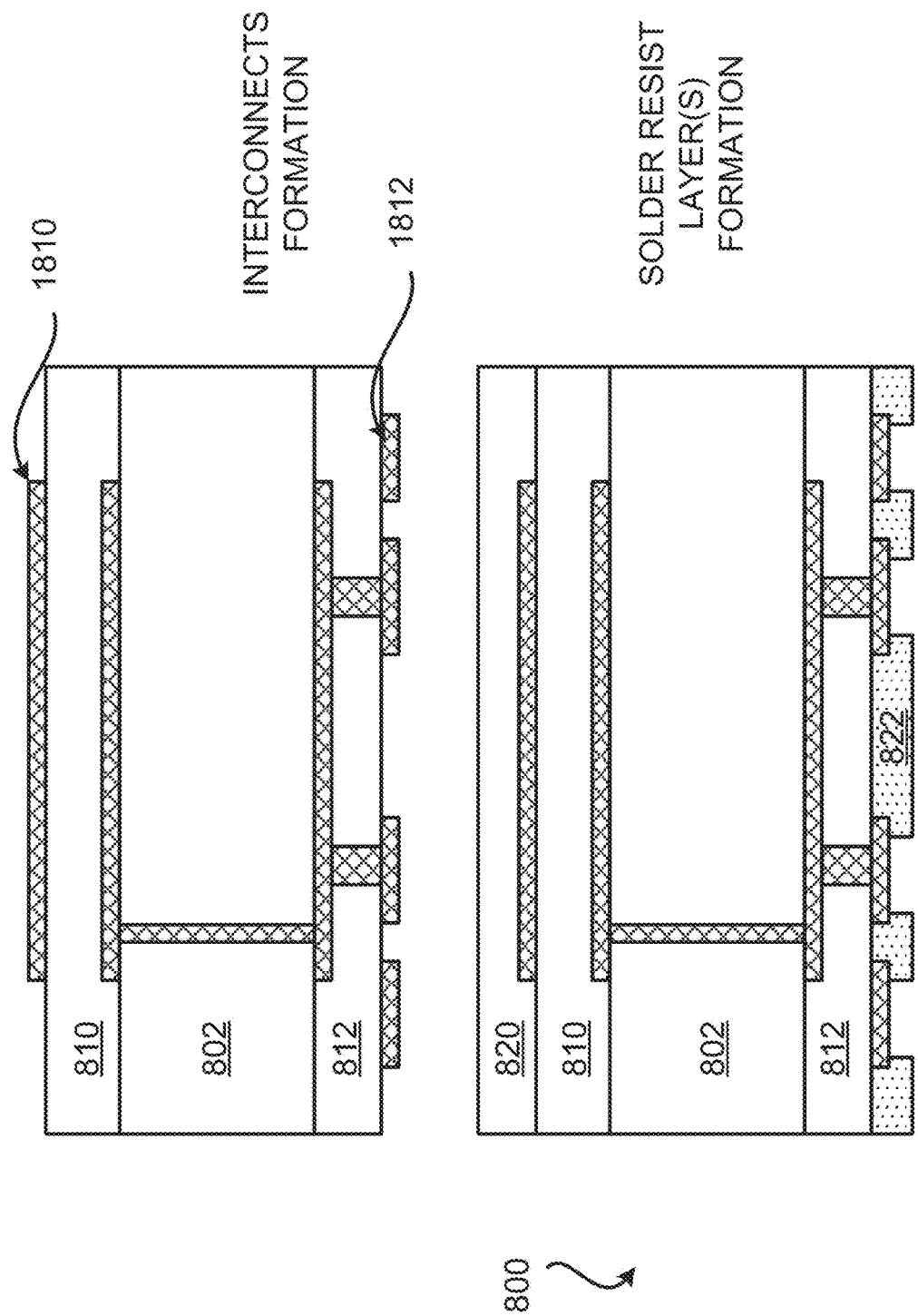

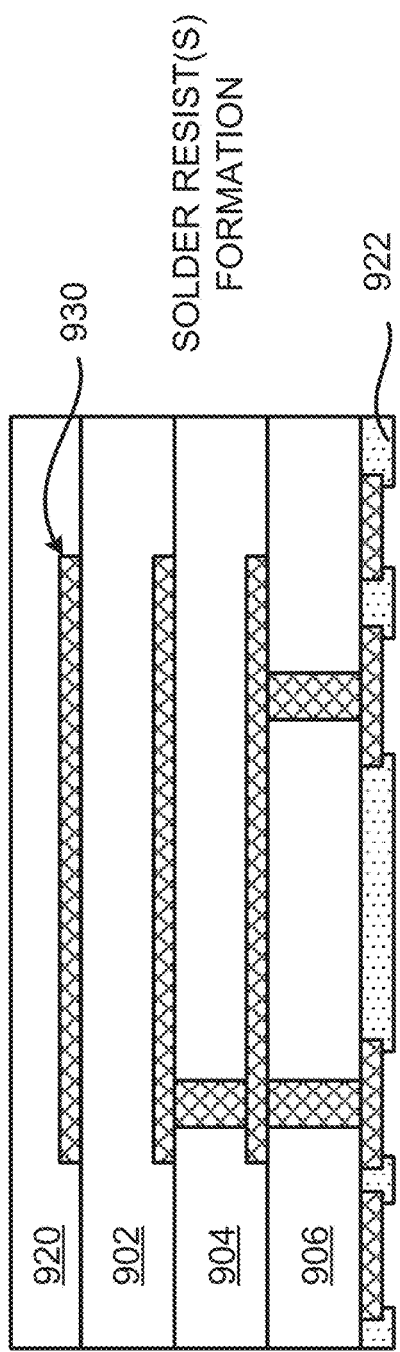
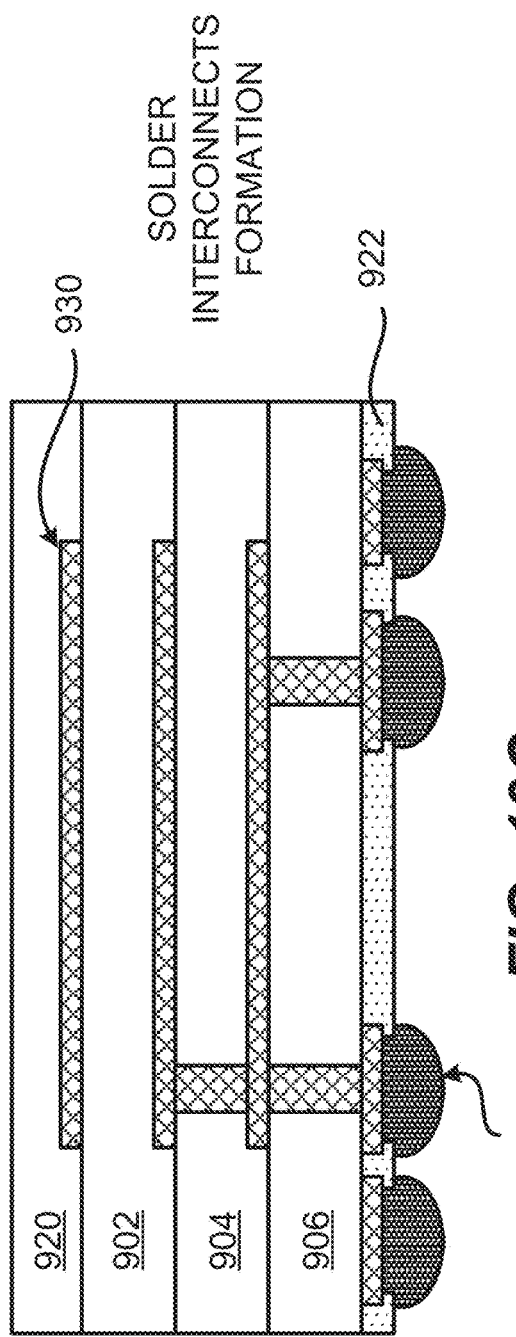
FIG. 19C

DEVICE COMPRISING MULTI-DIRECTIONAL ANTENNAS COUPLED THROUGH A FLEXIBLE PRINTED CIRCUIT BOARD

CROSS-REFERENCE/CLAIM OF PRIORITY TO RELATED APPLICATION

The present application claims priority to and the benefit of U.S. Provisional Application No. 63/018,384, filed on Apr. 30, 2020, and titled, "DEVICE COMPRISING MULTI-DIRECTIONAL ANTENNAS COUPLED THROUGH A FLEXIBLE PRINTED CIRCUIT BOARD", which is hereby expressly incorporated by reference.

FIELD

Various features relate to devices with an antenna, but more specifically to a device that includes antennas coupled through a printed circuit board.

BACKGROUND

FIG. 1 illustrates a package 100 that includes a substrate 102, a die 103 and a die 105. The die 103 and the die 105 are coupled to the substrate 102. The substrate 102 includes at least one dielectric layer 120 and a plurality of interconnects 122. The substrate 102 also includes a first antenna 150 and a second antenna 160. Both the first antenna 150 and the second antenna 160 are embedded in the substrate 102. The first antenna 150 is defined by a first plurality of interconnects 152, and the second antenna 160 is defined by a second plurality of interconnects 162. Both the first antenna 150 and the second antenna 160, are pointed in the same direction, which may limit the overall performance of the package 100 because signals may come from different directions. There is an ongoing need to provide packages with improved signal transmission and signal reception performances.

SUMMARY

Various features relate to devices with an antenna, but more specifically to a device that includes antennas coupled through a printed circuit board.

One example provides a device that includes a flexible printed circuit board (PCB), a package coupled to the flexible PCB, a first antenna device coupled to the flexible PCB, and a second antenna device coupled to flexible PCB.

Another example provides an apparatus that includes means for flexible interconnection, a package coupled to the means for flexible interconnection, a first antenna device coupled to the means for flexible interconnection, and a second antenna device coupled to the means for flexible interconnection.

Another example provides a method that couples a package to a flexible PCB. The method couples a first antenna device to the flexible PCB. The method couples a second antenna device to the flexible PCB.

BRIEF DESCRIPTION OF THE DRAWINGS

Various features, nature and advantages may become apparent from the detailed description set forth below when taken in conjunction with the drawings in which like reference characters identify correspondingly throughout.

FIG. 12 illustrates a top plan view of an exemplary flexible printed circuit board coupled to several discrete antenna devices.

FIG. 13 illustrates a top plan view of an exemplary flexible printed circuit board coupled to several discrete antenna devices.

FIG. 14 illustrates a top plan view of an exemplary flexible printed circuit board coupled to several discrete antenna devices.

FIGS. 18A-18D illustrate an exemplary sequence for fabricating a discrete antenna device.

FIGS. 19A-19C illustrate an exemplary sequence for fabricating another discrete antenna device.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a device that includes a flexible printed circuit board (PCB), a package coupled to the flexible PCB, a first antenna device coupled to the flexible PCB, and a second antenna device coupled to flexible PCB. The package may include a substrate and an integrated device. The first antenna device is configured to transmit and receive a first signal having a first frequency. The second antenna device is configured to transmit and receive a second signal having a second frequency. The first antenna device may be coupled to a second surface of the flexible PCB, and the second antenna device is coupled to the second surface of the flexible PCB. The first antenna device may be coupled to a second surface of the flexible PCB, and the second antenna device is coupled to a first surface of the flexible PCB. The flexible PCB may include at least one flexible interconnect and at least one flexible dielectric layer. The flexible PCB may include a means for flexible interconnection. The flexible PCB includes a flexible portion (e.g., portion that can be bent) so that the first antenna device and the second antenna device point at different directions, even if the first antenna device and the second antenna device are coupled to a same surface. This configuration improves an antenna device's ability to transmit and receive signals from different directions.

Figure 1:
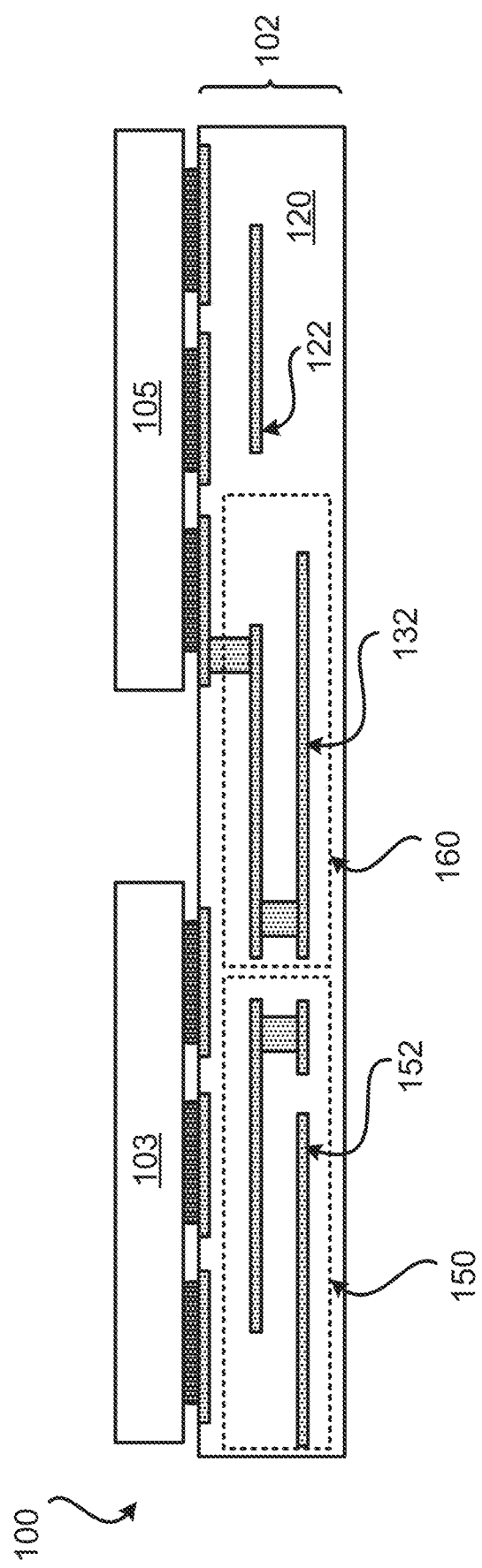
FIG. 1 illustrates a profile view of a package that includes a substrate with antennas embedded in the substrate.
Figure 2:
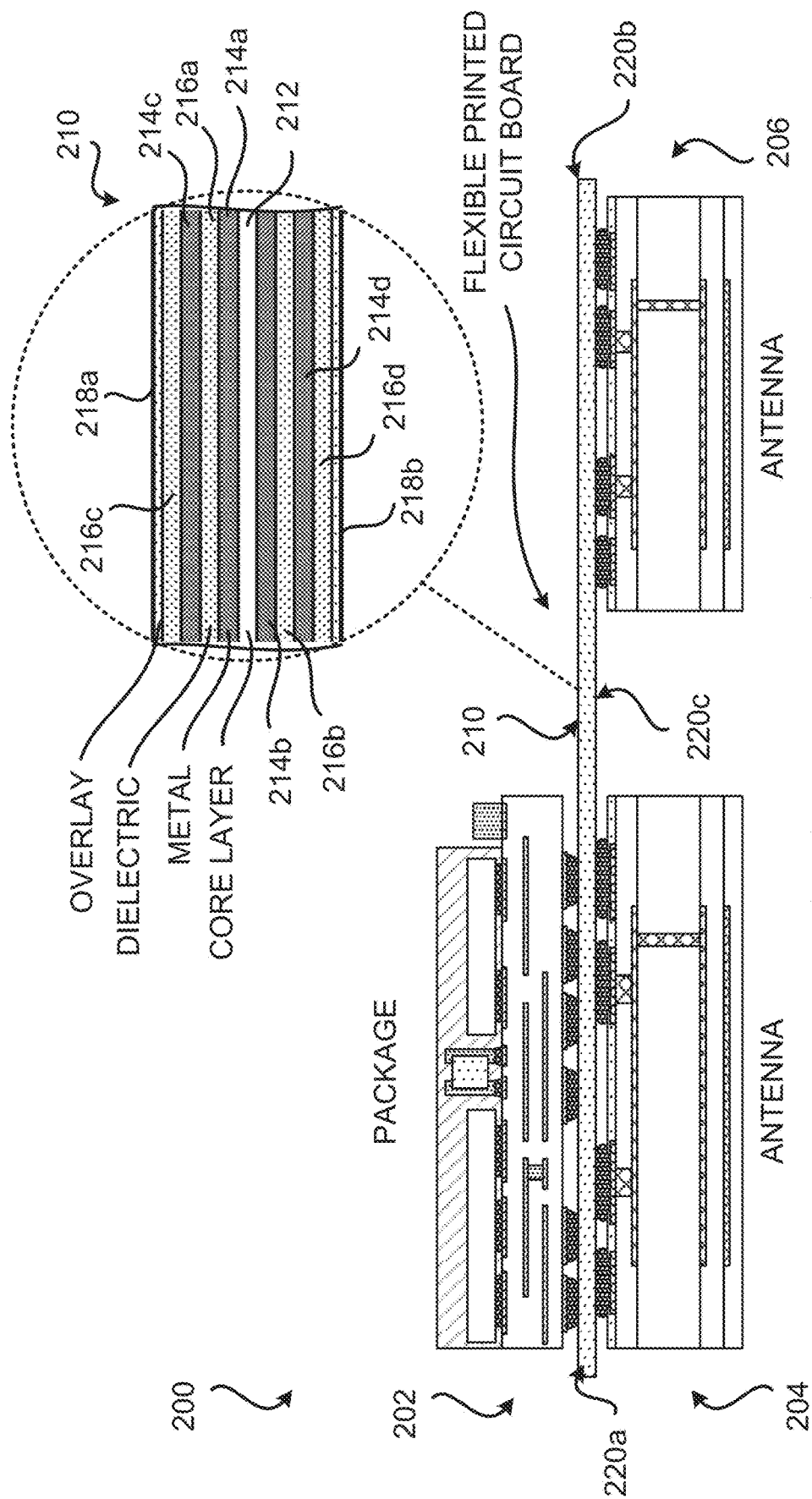
FIG. 2 illustrates a profile view of an exemplary device that includes a package and antenna devices coupled to a flexible printed circuit board.

Exemplary Device Comprising Substrates with Multi-Directional Antennas and Flexible Printed Circuit Board FIG. 2 illustrates a profile view of a device 200 that includes a package 202, an antenna device 204, an antenna device 206 and a flexible printed circuit board (PCB) 210. As will be further described below, the device 200 includes multi-directional antennas that help improve the performance of the device 200. The device 200 may include a radio frequency (RF) package. The device 200 may be configured to provide Wireless Fidelity (WiFi) communication and/or cellular communication (e.g., 2G, 3G, 4G, 5G). The device 200 may be configured to support Global System for Mobile Communications (GSM), Universal Mobile Telecommunications System (UMTS), and/or Long-Term Evolution (LTE). The device 200 may be configured to transmit and receive signals having different frequencies and/or communication protocols.

The package 202 is coupled (e.g., through solder interconnects) to a first surface of a first portion 220a of the flexible PCB 210. The antenna device 204 is coupled (e.g., through solder interconnects) to a second surface of the first portion 220a of the flexible PCB 210. The antenna device 204 may be located opposite to the package 202. The antenna device 206 is coupled (e.g., through solder interconnects) to a second surface of a second portion 220b of the flexible PCB 210. The package 202 may be configured to be electrically coupled to the antenna device 204 and the antenna device 206 through the flexible PCB 210. The flexible PCB 210 includes a flexible portion 220c that is located between the first portion 220a and the second portion 220b. The package 202 may include various components, such as an integrated device. An antenna device may include at least one antenna. The package 202, the antenna device 204 and the antenna device 206 will be described in further details below in at least FIGS. 6, 8 and 9.

The flexible PCB 210 is configured to provide several electrical paths and/or electrical connections for various components. As an example, the flexible PCB 210 may be configured to electrically couple the package 202 to the antenna devices 204 and 206. The flexible PCB 210 may be configured to allow different currents (e.g., signal, power, ground) to travel between at least one package (e.g., package 202) and at least one antenna device (e.g., antenna devices 204 and 206). For example, the flexible PCB 210 may include (i) at least one first interconnect configured for a signal (e.g., input/output signal), (ii) at least one second interconnect configured for power, and (iii) at least one third interconnect configured for ground. The flexible PCB 210 includes a flexible portion 220c (e.g., bendable portion) is bendable such that the antenna device 204 may be positioned at an angle to the antenna device 206, and vice versa. The flexible PCB 210 may be a means for flexible interconnection.

In at least some implementations, the flexible PCB 210 may include a flexible portion (e.g., bendable portion) that is configured to be bendable up to 180 degrees without fracturing. Thus, for example, components of the flexible PCB 210, such as the at least one dielectric layer (e.g., flexible dielectric layer), the at least one interconnect (e.g., flexible interconnect) and/or at least one overlay, may bend up to 180 degrees without causing damage, a crack and/or a fracture in the flexible PCB 210. Various implementations of the flexible PCB 210 may be bendable up to different degrees. For example, in at least some implementations, the flexible PCB 210 may include a flexible portion (e.g., bendable portion) that is configured to be bendable up to 90 degrees without fracturing and/or cracking. In at least some implementations, the flexible PCB 210 may include a flexible portion (e.g., bendable portion) that is configured to be bendable by at least 10 degrees (or more) without fracturing and/or cracking. The term "flexible" may mean that a component is (i) bendable by at least 10 degrees (or more) without fracturing and/or cracking, and/or (ii) bendable up to 180 degrees without fracturing and/or cracking.

The flexible PCB 210 includes a flexible core layer 212, at least one flexible interconnect 214 (e.g., 214a, 214b, 214c, 214d), at least one flexible dielectric layer 216 (e.g., 216a, 216b, 216c, 216d), and at least one overlay 218 (e.g., 218a, 218b). The flexible interconnects 214 and the flexible dielectric layers 216 may be interleaved. For example, a flexible interconnect 214a may be coupled to a first surface of the flexible core layer 212, a flexible dielectric layer 216a may be coupled to the flexible interconnect 214a, a flexible interconnect 214c may be coupled to the flexible dielectric layer 216a, and a flexible dielectric layer 216c may be coupled to the flexible interconnect 214c. The overlay 218a may be coupled to the flexible dielectric layer 216c. The overlay 218a may be a flexible overlay. A flexible interconnect 214b may be coupled to a second surface of the flexible core layer 212, a flexible dielectric layer 216b may be coupled to the flexible interconnect 214b, a flexible interconnect 214d may be coupled to the flexible dielectric layer 216b, and a flexible dielectric layer 216d may be coupled to the flexible interconnect 214d. The overlay 218b may be coupled to the flexible dielectric layer 216d. The overlay 218b may be a flexible overlay. The overlay 218b may part of the overlay 218a. The flexible dielectric layer(s) and/or the overlay(s) may include polyimide. The use of the overlay may help the flexible PCB to be flexible.

In some implementations, the flexible PCB 210 may include at least solder resist layer (not shown) that is formed over and coupled to the flexible dielectric layer (e.g., 216c, 216d). For example, for some portions of the flexible PCB 210, instead of an overlay, the flexible dielectric layer may be covered by a solder resist layer. The flexible PCB 210 may include a flexible portion (e.g., bendable portion) where at least one overlay covers and surrounds the flexible dielectric layer(s). A portion of the flexible PCB 210 that is covered by the overlay may be a portion that is designed and/or configured to be flexible and/or bendable. In some implementations, portions that are not designed nor intended to be bendable may be covered by at least one solder resist layer. An example of a portion covered by a solder resist layer is described in at least FIG. 4.

Each of the flexible interconnects (e.g., 214a, 214b, 214b, 214d) may be configured to provide an electrical path for different currents (e.g., signal, power, ground) to travel in the flexible PCB 210. The flexible PCB 210 may have different numbers of flexible interconnects and flexible dielectric layers. In some implementations, the flexible core layer 212 may include a flexible dielectric layer. The flexible PCB 210 may have different shapes and sizes. The flexible PCB 210 may include other components and/or materials. For example, the flexible PCB 210 may include a different number of flexible interconnects (e.g., metal layer). The flexible PCB 210 includes a four metal layers. In some implementations, there may be more or less than four metal layers. Moreover, one or more adhesive may be used to couple the dielectric layer(s) to the interconnects, and vice versa.

As will be further described below, the flexible PCB 210 is configured to allow antennas and/or antenna devices to point to different directions. This configuration and/or other configurations, may allow the device 200 to provide better transmission and/or reception performance, as the various antennas are aligned in multiple and different directions, instead of just one direction.

Figure 3:
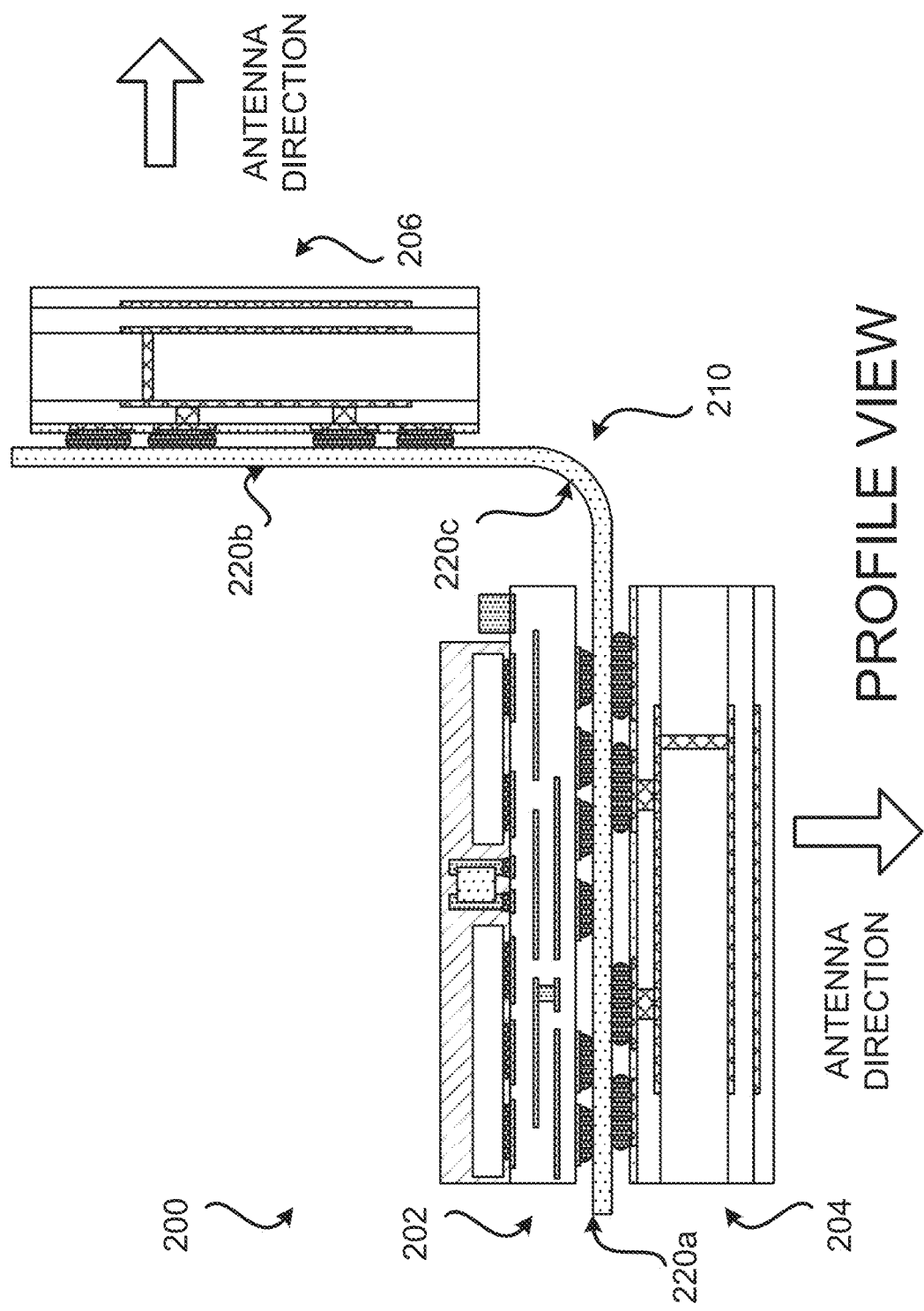
FIG. 3 illustrates a profile view of an exemplary device that includes a package and antenna devices coupled to a flexible printed circuit board.

FIG. 3 illustrates the device 200 that includes the package 202, the antenna device 204, the antenna device 206 and the flexible PCB 210. As shown in FIG. 3, the flexible PCB 210 is bent so that the antenna device 204 and the antenna device 206 point in different directions. The flexible PCB 210 includes a portion 220a, a portion 220b and a flexible portion 220c, and the flexible PCB 210 is bent in the flexible portion 220c. The flexible portion 220c is configured to be flexible or bendable by at least a certain degree without fracturing and/or cracking. The flexible portion 220c is located between the portion 220a and the portion 220b. The portion 220a and/or the portion 220b may also be a flexible portion. The portion 220a and/or the portion 220b may be a device coupling portion of the flexible PCB 210, where devices (e.g., antenna devices, integrated devices, passive devices) and/or packages may be coupled to (e.g., above and/or below) the flexible PCB 210. In some implementations, the flexible portion 220c may be covered by at least one overlay (e.g., dielectric such as polyimide). In some implementations, the portion 220a and/or the portion 220b may be covered by at least one solder resist layer. Examples of portions of a flexible PCB are further illustrated and described in at least FIGS. 12-14 and 15A-15B.

As shown in FIG. 3, the flexible portion 220c of the flexible PCB 210 is bent so that the antenna device 206 is positioned relative to the antenna device 204 such that the antenna direction for the antenna device 204 faces a first direction (e.g., along X direction, Y direction, Z direction), and the antenna direction for the antenna device 206 faces a second direction (e.g., along Y direction, Y direction, Z direction) that is different than the first direction. For example, the antenna device 204 may include a first antenna that includes a first antenna direction, and the antenna device 206 may include a second antenna that includes a second antenna direction. This configuration and/or other configurations, may allow the device 200 to provide better transmission and/or reception performance, as the various antennas are aligned in multiple and different directions, instead of just one direction.

Figure 4:
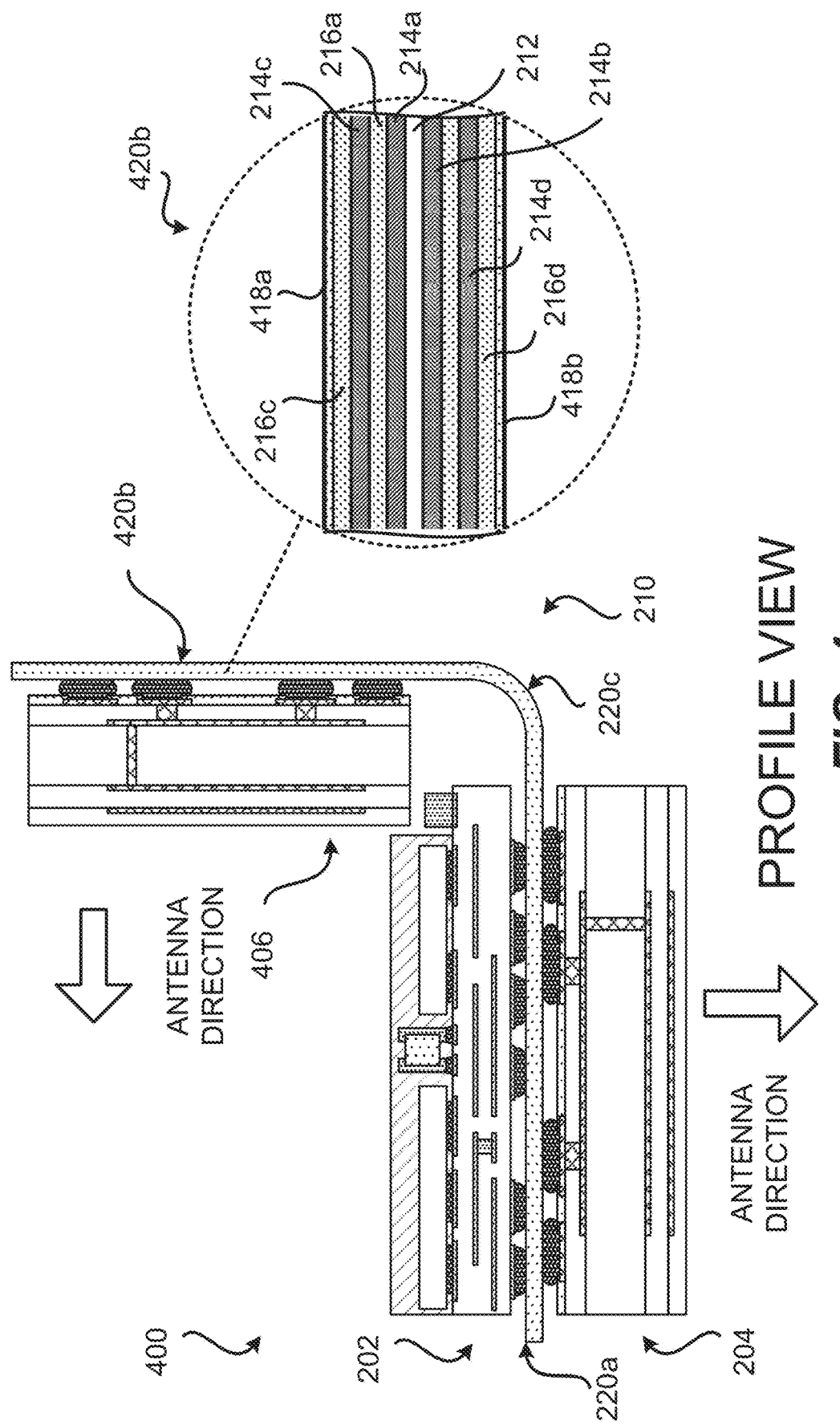
FIG. 4 illustrates a profile view of an exemplary device that includes a package and antenna devices coupled to a flexible printed circuit board.

FIG. 4 illustrates a device 400 that includes the package 202, the antenna device 204, an antenna device 406 and the flexible PCB 210. The device 400 is similar to the device 300. The antenna device 406 may be the same or similar to the antenna device 206. The antenna device 406 is coupled (e.g., through solder interconnects) to a fourth portion of the first surface of the flexible PCB 210. The flexible PCB 210 includes the portion 220a, a portion 420b and the flexible portion 220c. As shown in FIG. 4, the flexible portion 220c of the flexible PCB 210 is bent so that the antenna device 406 is positioned relative to the antenna device 204 such that the antenna direction for the antenna device 204 faces a first direction (e.g., along X direction, Y direction, Z direction), and the antenna direction for the antenna device 406 faces a third direction (e.g., along Y direction, Y direction, Z direction) that is different than the first direction. For example, the antenna device 204 may include a first antenna that includes a first antenna direction, and the antenna device 406 may include a third antenna that includes a third antenna direction. The direction that the antenna device 406 faces may be opposite to the direction that the antenna device 206 faces.

FIG. 4 also illustrates that the portion 420b of the flexible PCB 210 is covered by at least one solder resist layer (e.g., 418a, 418b). The solder resist layer 418a may be formed over and coupled to the flexible dielectric layer 216c. The solder resist layer 418b may be formed over and coupled to the flexible dielectric layer 216d. The solder resist layer 418a and the solder resist layer 418b may be a same solder resist layer. The portion 220a may include at least one solder resist layer as described for the portion 420b.

Figure 5:
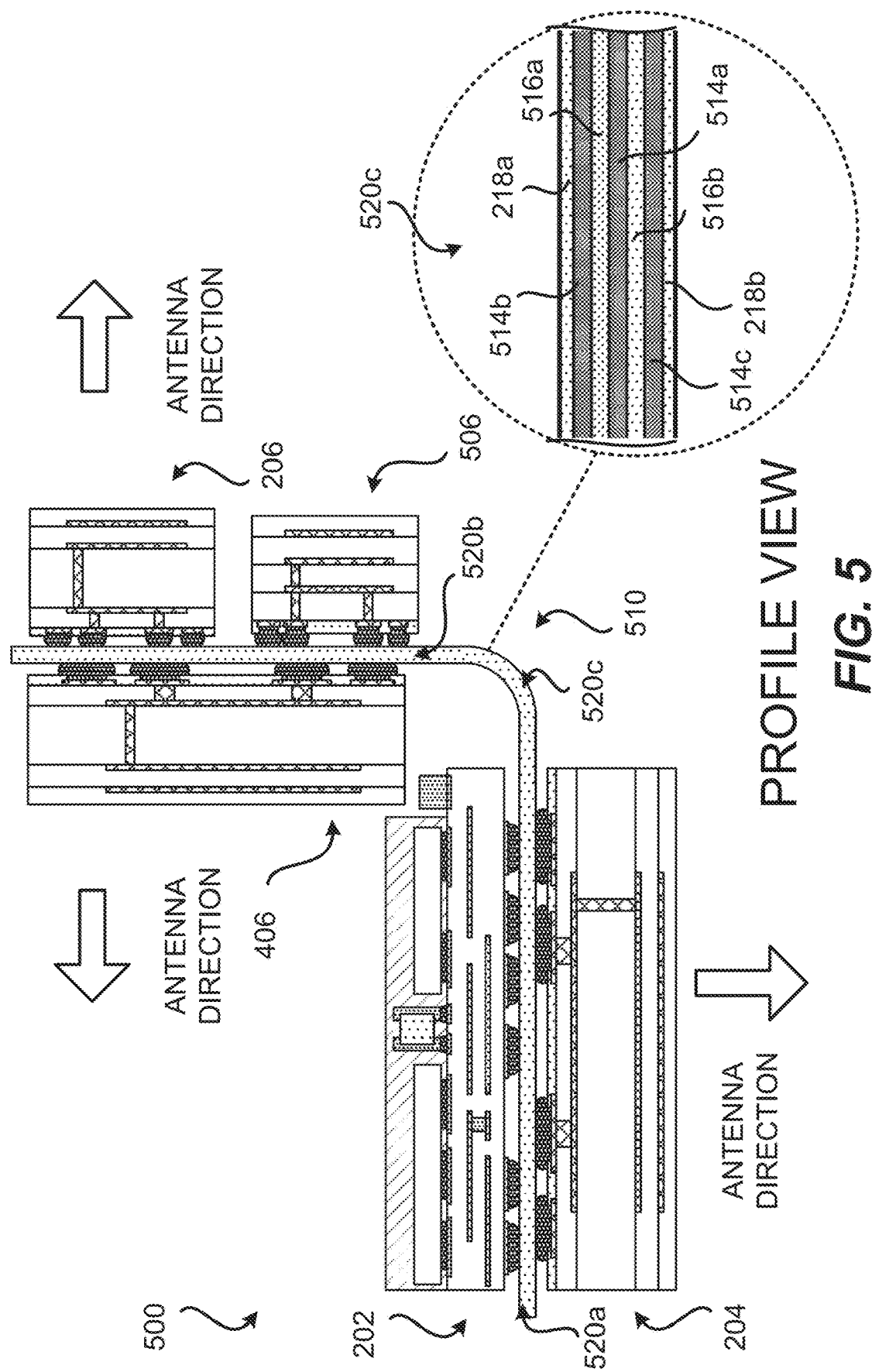
FIG. 5 illustrates a profile view of an exemplary device that includes a package and antenna devices coupled to a flexible printed circuit board.

FIG. 5 illustrates a device 500 that includes the package 202, the antenna device 204, the antenna device 206, the antenna device 406, an antenna device 506 and the flexible PCB 510. The flexible PCB 510 may be similar to the flexible PCB 210, and as such, the flexible PCB 510 may be capable of performing the same or similar functions as described for the flexible PCB 210.

The flexible PCB 510 includes a portion 520a, a portion 520b and a flexible portion 520c. The flexible portion 520c is configured to be flexible or bendable by at least a certain degree without fracturing and/or cracking. The flexible portion 520c is located between the portion 520a and the portion 520b. The portion 520a and/or the portion 520b may also be a flexible portion. The portion 520a and/or the portion 520b may be device coupling portions of the flexible PCB 510, where devices (e.g., antenna devices, integrated devices, passive devices) and/or packages may be coupled to the flexible PCB 510. As shown in FIG. 5, the flexible PCB 510 includes a plurality of flexible interconnects (e.g., 514a, 514b, 514c), and at least one flexible dielectric layer (e.g., 516a, 516b). In some implementations, the flexible portion 520c may be covered by at least one overlay (e.g., 218a, 218b). An overlay may include a dielectric such as polyimide. In some implementations, the portion 520a and/or the portion 520b may be covered by at least one solder resist layer. Examples of portions of a flexible PCB are further illustrated and described in at least FIGS. 12-14 and 15A-15B.

The flexible PCB 510 may include fewer metal layers than the flexible PCB 210. For example, the flexible PCB 210 includes four metal layers, while the flexible PCB 510 includes three metal layers. As will be further described below, the flexible PCB 210 and/or the flexible PCB 510 may include at least one flexible portion. In some implementations, the flexible PCB 210 and/or the flexible PCB 510 may have an overall thickness of approximately 200 micrometers (μm) or less. It is noted that the flexible PCB 510 may be implemented in any of the devices described in the disclosure.

The antenna devices (e.g., 204, 206, 406, 506) may be coupled to the flexible PCB 210 such that at least some of the antenna devices may point in different directions. For example, (i) the antenna direction for the antenna device 204 faces a first direction (e.g., along X direction, Y direction, Z direction), (ii) the antenna direction for the antenna device 206 and the antenna device 506 faces a second direction (e.g., along Y direction, Y direction, Z direction) that is different than the first direction, and (iii) the antenna direction for the antenna device 406 faces a third direction (e.g., along Y direction, Y direction, Z direction) that is different than the first direction and the second direction. The antenna device 204 may include a first antenna that includes a first antenna direction, the antenna device 206 may include a second antenna that includes a second antenna direction, the antenna device 506 may include an antenna that includes the second antenna direction, and the antenna device 406 may include a third antenna that includes a third antenna direction.

Different implementations may bend the flexible PCB (e.g., 210, 510) by different angles and/or degrees. Different implementations may have different numbers of antenna devices coupled to different surfaces of the flexible PCB (e.g., 210, 510). Different implementations may have a flexible PCB (e.g., 210, 510) with different sizes and/or shapes. Different implementations may have a flexible PCB with a different number of flexible portions (e.g., at least one flexible portion).

The various antenna devices (e.g., 204, 206, 406, 506) may be configured to transmit and receive signals having different frequencies and/or communication protocols. A first antenna device may be a first means for transmitting and receiving a first signal. A second antenna device may be a second means for transmitting and receiving a second signal. A third antenna device may be a third means for transmitting and receiving a third signal. A fourth antenna device may be a fourth means for transmitting and receiving a fourth signal. The first signal, the second signal, the third signal, and/or the fourth signal may have the same or different properties. For example, the signals may have the same or different frequencies and/or communication protocols. A signal may be an analog signal or a digital signal.

One advantage of using discrete antenna devices is the ability to design and configure the package to meet specific operational requirements of cellular network operators, without having to redesign an entire substrate. Thus, various discrete antenna devices may be mixed and matched together to work with different cellular network operations. The antenna devices (e.g., 204, 206, 406, 506) may be discrete from the flexible PCB 210 because the antenna devices are fabricated during a process that is separate than the fabrication of the flexible PCB 210. Another advantage of the discrete antenna devices is that they are not limited by the size, dimensions, and fabrication limitations of the flexible PCB 210. For example, an antenna device may partially overhang over the flexible PCB 210. Different implementations may use the same or different types of antenna devices. The antenna devices may have the same sizes, shapes, and/or configurations, or they may have different sizes, shapes, and/or configurations.

Figure 6:
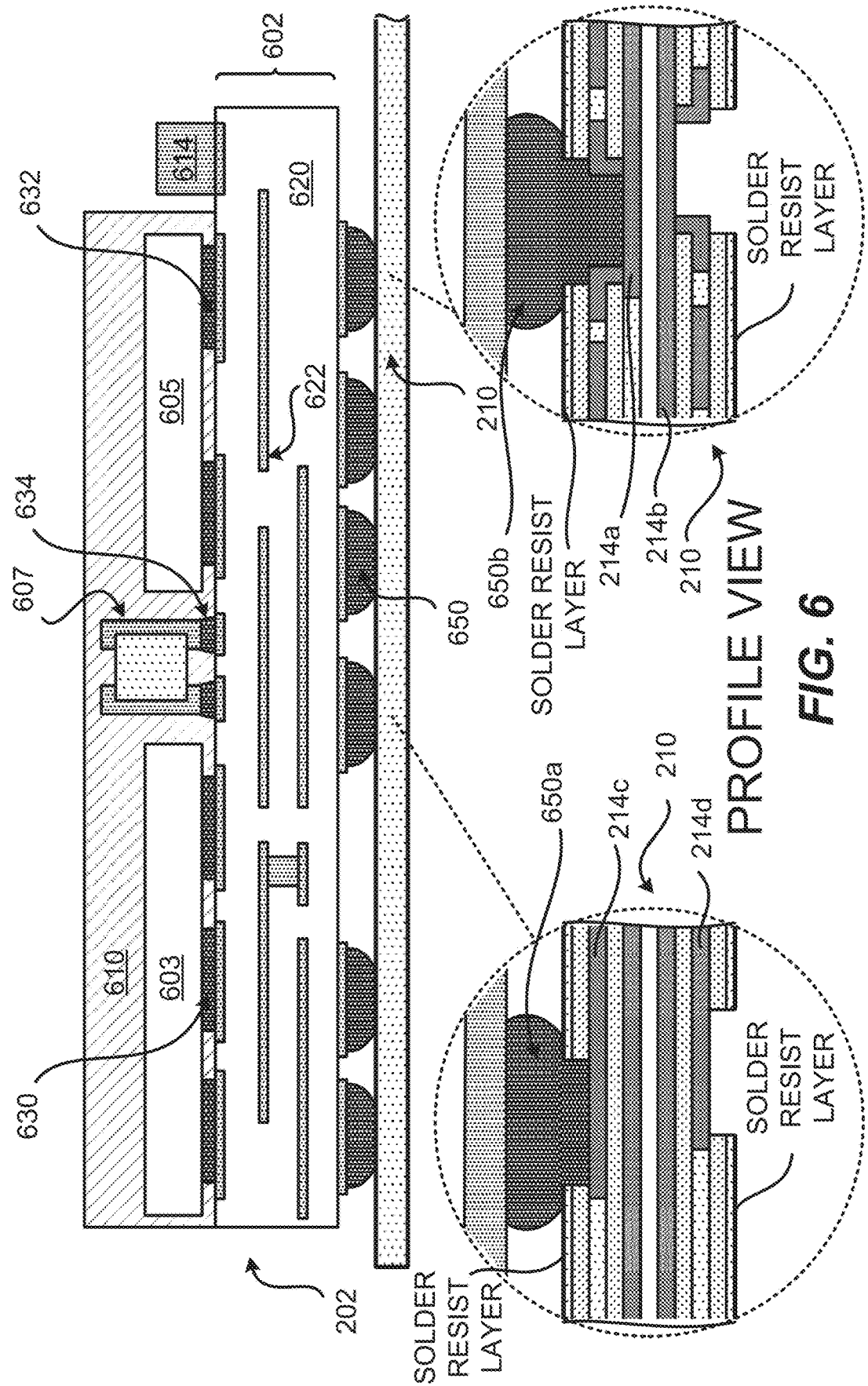
FIG. 6 illustrates a profile view of an exemplary device that includes a package coupled to a flexible printed circuit board.

FIG. 6 illustrates a close-up view of the package 202 coupled to the flexible PCB 210 through the plurality of solder interconnects 650. As shown in FIG. 6, the solder interconnect 650a is configured to be electrically coupled to the flexible interconnect 214c, and the solder interconnect 650b is configured to be electrically coupled to the flexible interconnect 214a. The package 202 may be coupled to a portion 220a of the flexible PCB 210. The portion 220a may be covered by at least one solder resist layer. However, in some implementations, the portion 220a may be covered by at least one overlay.

FIG. 6 illustrates a profile view of a package 202 that includes at least one integrated device. The package 202 may be configured as a radio frequency (RF) package. The package 202 may be configured to provide Wireless Fidelity (WiFi) communication and/or cellular communication (e.g., 2G, 3G, 4G, 5G). The package 202 may be configured to support Global System for Mobile Communications (GSM), Universal Mobile Telecommunications System (UMTS), and/or Long-Term Evolution (LTE). The package 202 may be configured to transmit and receive signals having different frequencies and/or communication protocols.

The package 202 includes a substrate 602, a first integrated device 603, a second integrated device 605, a passive device 607, and a connector 614. The substrate 602 includes at least one dielectric layer 620 and a plurality of interconnects 622. The substrate 602 includes a first surface (e.g., top surface) and a second surface (e.g., bottom surface). The first integrated device 603 is coupled to the first surface of the substrate 602, through a plurality of solder interconnects 630. The second integrated device 605 is coupled to the first surface of the substrate 602, through a plurality of solder interconnects 632. The first integrated device 603 and the second integrated device 605 may include a die (e.g., processor die, memory die). The passive device 607 is coupled to the first surface of the substrate 602, through a plurality of solder interconnects 634. A passive device may include a capacitor or an inductor. For example, the passive device 607 is a capacitor. The connector 614 is coupled to the first surface of the substrate 602.

The package 202 may include an encapsulation layer 610. The encapsulation layer 610 may be formed over the first surface of the substrate 602. The encapsulation layer 610 may encapsulate the first integrated device 603, the second integrated device 605 and the passive device 607. The encapsulation layer 610 may include a mold, a resin and/or an epoxy. The encapsulation layer 610 may be a means for encapsulation.

The package 202 may include the connector 614. The connector 614 may be configured to allow the package 202 to be electrically coupled to one or more other devices. Different implementations may use different types of connections to electrically couple the package 202 to other devices. For example, the package 202 may be coupled to the other devices through wires and/or flexible interconnects. Power for the package 202 may be provided through the connector 614.

The first integrated device 603 and the second integrated device 605 may be coupled to the flexible PCB 210 through the plurality of interconnects 622 of the substrate 602. For example, the first integrated device 603 may be configured to be electrically coupled through the plurality of solder interconnects 630, the plurality of interconnects 622 and the plurality of solder interconnects 650 (e.g., 650a). In another example, the second integrated device 605 may be configured to be electrically coupled through the plurality of solder interconnects 650, the plurality of interconnects 622 and the plurality of solder interconnects 650 (e.g., 650b). The first integrated device 603 and/or the second integrated device 605 may be coupled to at least one antenna device (e.g., 204, 206, 406, 506) through the flexible interconnects 214 of the flexible PCB 210. An integrated device (e.g., 1208) may include a die (e.g., bare die). An integrated device (e.g., 603, 605) may include a radio frequency (RF) device, a passive device, a filter, a capacitor, an inductor, an antenna, a transmitter, a receiver, a surface acoustic wave (SAW) filters, a bulk acoustic wave (BAW) filter, a light emitting diode (LED) integrated device, a silicon carbide (SiC) based integrated device, memory, and/or combinations thereof.

At least one antenna device (e.g., 204, 206, 406, 506) may be coupled to the flexible PCB 210 in a similar manner as described for the package 202 being coupled to the flexible PCB 210. The at least one antenna device (e.g., 204, 206, 406, 506) may be coupled to a first side and/or a second side of the flexible PCB 210. For example, the at least one antenna device (e.g., 204, 206, 406, 506) may be coupled to interconnects 214a, 214b, 214c and/or 214d of the flexible PCB 210.

Figure 7:
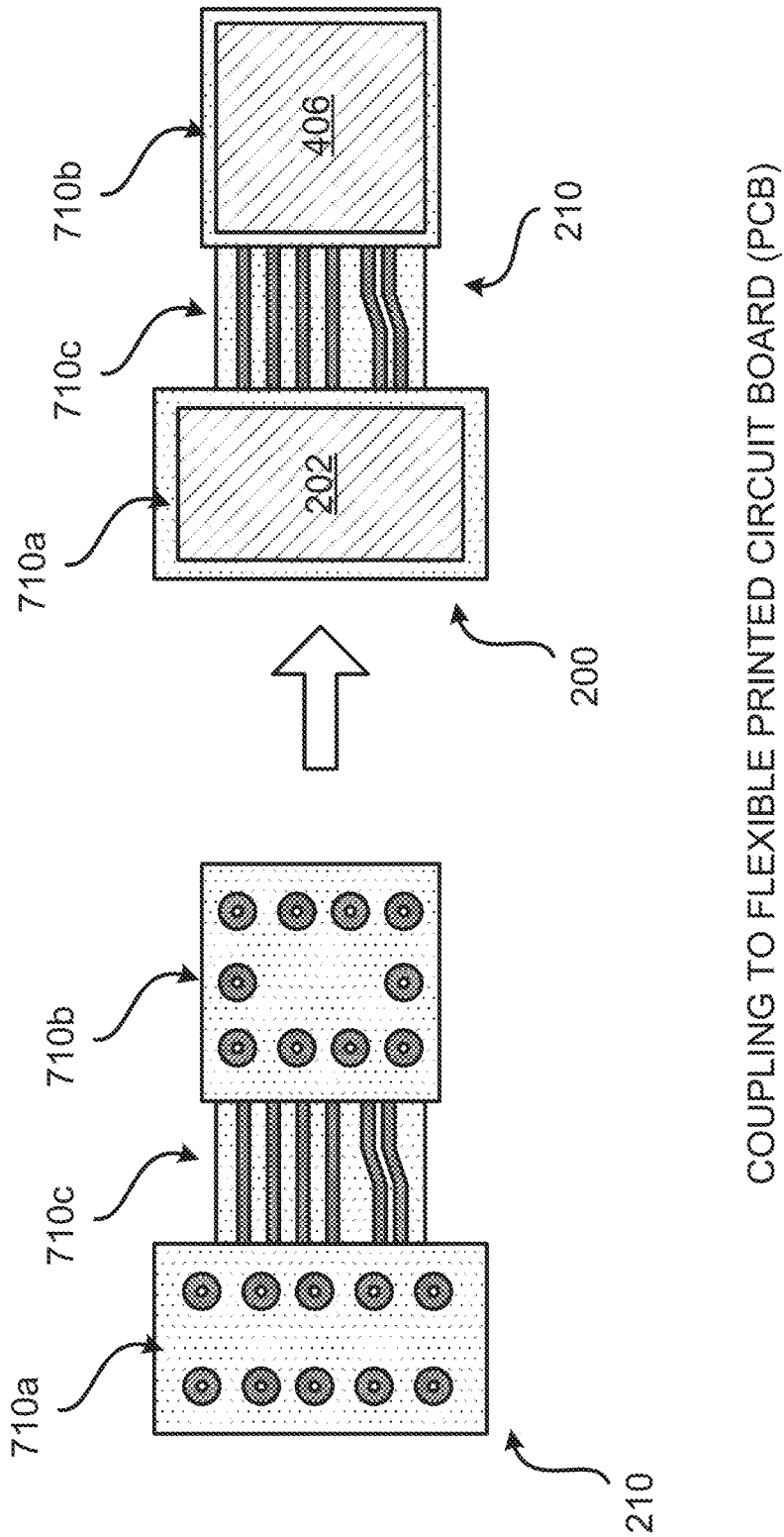
FIG. 7 illustrates a plan view of an exemplary device that includes a package and antenna devices coupled to a flexible printed circuit board.

FIG. 7 illustrates a top plan view of packages and antenna devices being coupled to a flexible PCB. As shown in FIG. 7, the flexible PCB 210 includes a first portion 710a, a second portion 710b and a third portion 710c. The first portion 710a has a first shape and a first size. The second portion 710b has a second shape and a second size. The third portion 710c has a third shape and a second size. The third portion 710c may be a flexible portion. The third portion 710c is located between the first portion 710a and the second portion 710b. The package 202 is coupled to the first surface of the first portion 710a of the flexible PCB 210. The antenna device 406 is coupled to the first surface of the second portion 710b of the flexible PCB 210. Other antenna devices may be coupled to the second surface of the first portion 710a and/or the second portion 710b. The package 202 may be electrically coupled to the antenna device 406 through the third portion 710c of the flexible PCB 210.

Exemplary Discrete Antenna Devices

Figure 8:
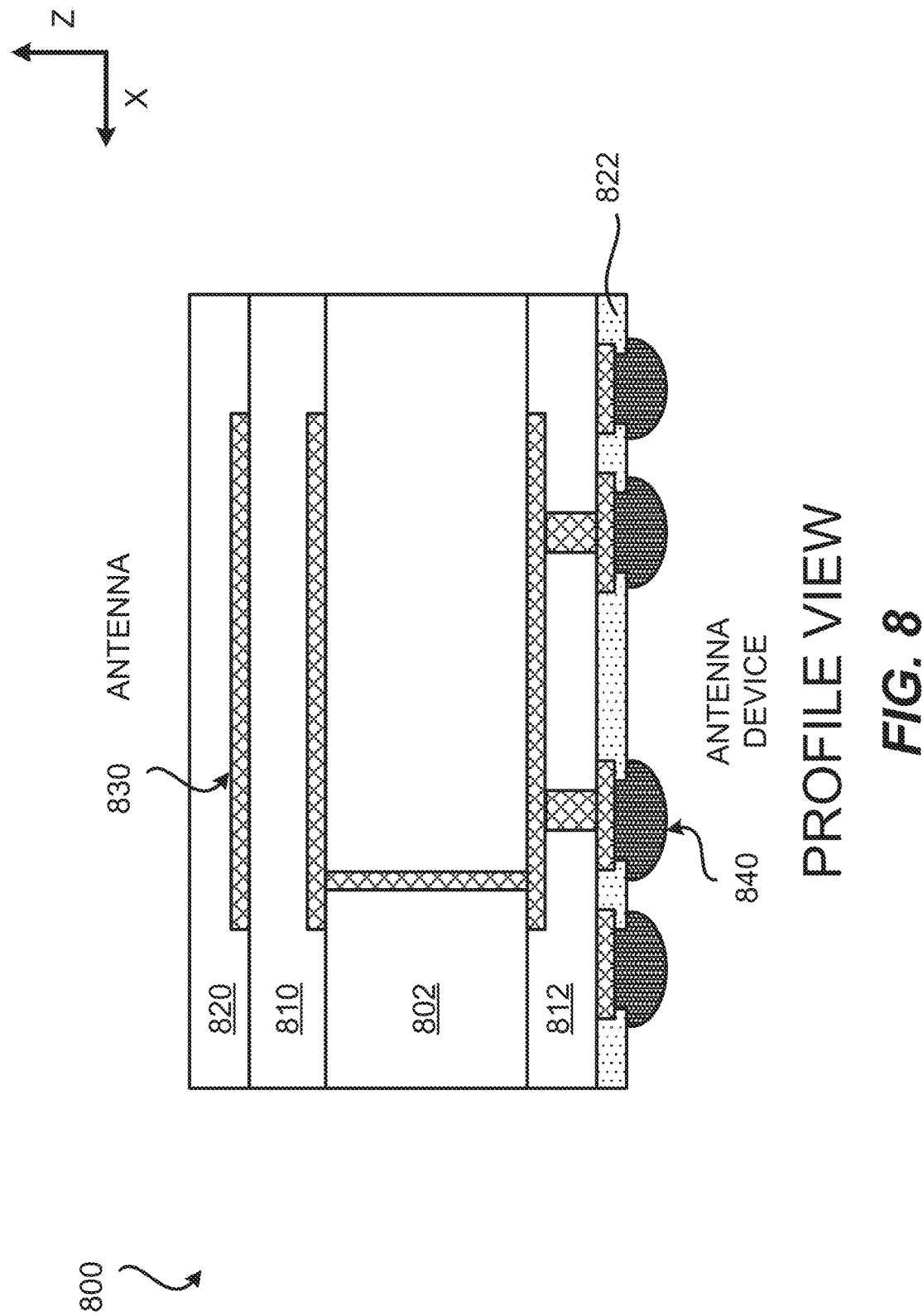
FIG. 8 illustrates a profile view of an exemplary discrete antenna device.

FIG. 8 illustrates an antenna device 800. The antenna device 800 may represent any of the antenna devices (e.g., 204, 206, 406) described in the disclosure. The antenna device 800 may be a means for transmitting and receiving a signal. The antenna device 800 may be coupled to a flexible PCB or a substrate of a package. The antenna device 800 may be a discrete antenna device that is fabricated during a fabrication process that is separate than a process used to fabricate a substrate or a flexible PCB.

The antenna device 800 includes a first dielectric layer 802, a second dielectric layer 810, a third dielectric layer 812, a first solder resist layer 820, a second solder resist layer 822, and a plurality of interconnects 830. The first dielectric layer 802 may be a core layer. The second dielectric layer 810 is formed over a first surface of the first dielectric layer 802. The third dielectric layer 812 is formed over a second surface of the first dielectric layer 802. The plurality of interconnects 830 may be located and formed in and over the first dielectric layer 802, the second dielectric layer 810, and the third dielectric layer 812. The plurality of interconnects 830 may include vias, pads and/or traces. At least one interconnect from the plurality of interconnects 830 may be configured to operate as an antenna capable of transmitting and/or receiving signals. The antenna device 800 may include one or more antennas. One or more antennas may be located on a top metal layer of the antenna device 800. A top metal layer of the antenna device 800 may be a metal layer that is furthest away from the plurality of solder interconnects 840. It is noted that an antenna may be located on any metal layer of the antenna device 800. An antenna may be located on multiple metal layers of the antenna device 800. It is noted that different implementations may have different numbers of dielectric layers and/or different number of metal layers. The first solder resist layer 820 is formed over the second dielectric layer 810, and the second solder resist layer 822 is formed over the third dielectric layer 812. The antenna device 800 may include a plurality of solder interconnects 840. The plurality of solder interconnects 840 is coupled to the plurality of interconnects 830. Examples of dielectric layers include organic dielectric materials and/or ceramics. In some implementations, some of the dielectric layers may be considered part of the same dielectric layer.

Figure 9:
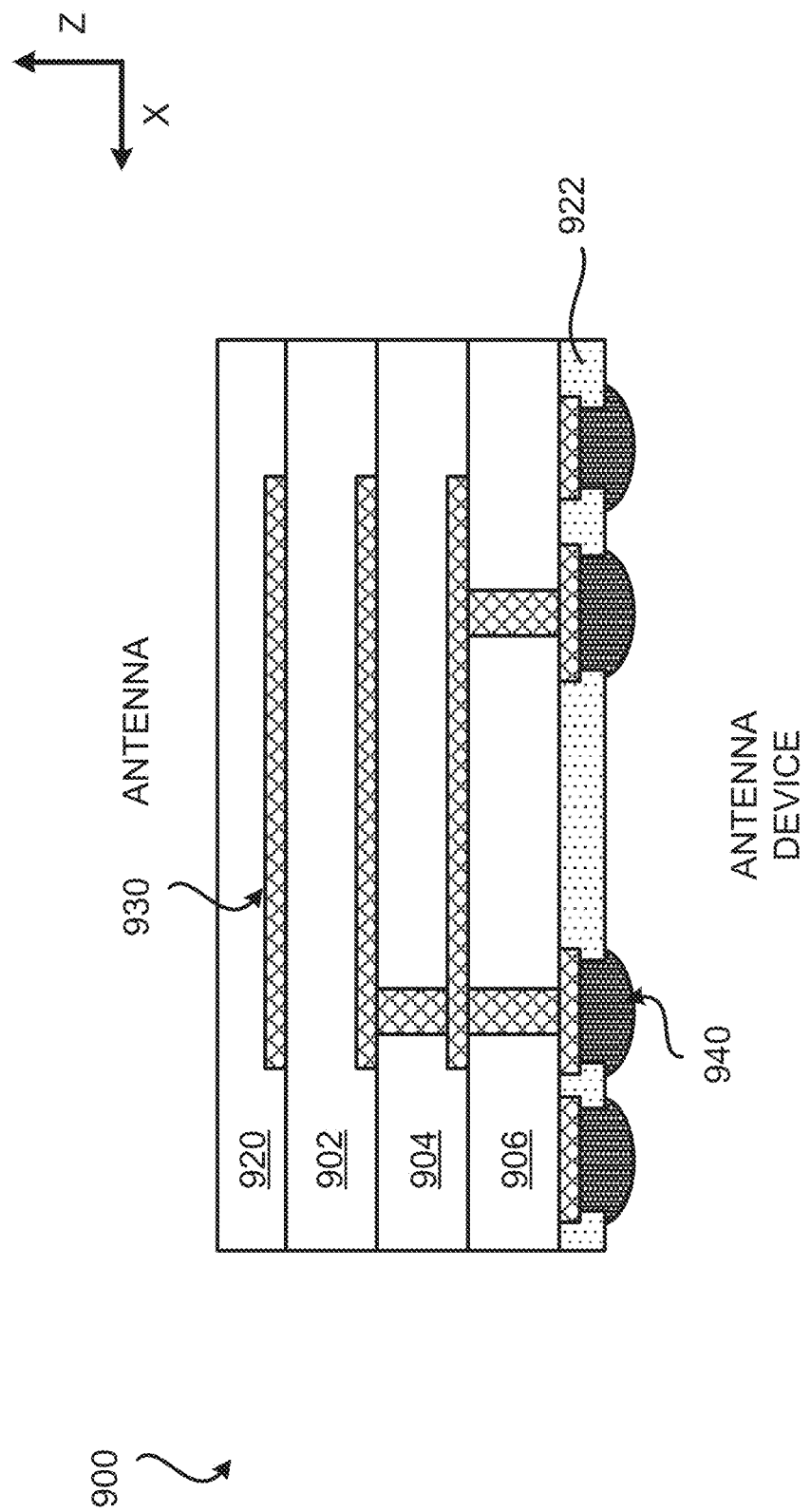
FIG. 9 illustrates a profile view of another exemplary discrete antenna device.

FIG. 9 illustrates an antenna device 900. The antenna device is another example of an antenna device that may be implemented with a substrate. The antenna device 900 may represent any of the antenna devices (e.g., 506) described in the disclosure. The antenna device 900 may be a means for transmitting and receiving a signal. The antenna device 900 may be coupled to a flexible PCB or a substrate of a package. The antenna device 900 may be a discrete antenna device that is fabricated during a fabrication process that is separate than a process used to fabricate a substrate.

The antenna device 900 includes a first dielectric layer 902, a second dielectric layer 904, a third dielectric layer 906, a first solder resist layer 920, a second solder resist layer 922, and a plurality of interconnects 930. The second dielectric layer 905 is formed over the third dielectric layer 906. The first dielectric layer 902 is formed over the second dielectric layer 904. The plurality of interconnects 930 may be located and formed in and over the first dielectric layer 902, the second dielectric layer 904, and the third dielectric layer 906. The plurality of interconnects 930 may include vias, pads and/or traces. At least one interconnect from the plurality of interconnects 930 may be configured to operate as an antenna capable of transmitting and/or receiving signals. The antenna device 900 may include one or more antennas. One or more antennas may be located on a top metal layer of the antenna device 900. A top metal layer of the antenna device 900 may be a metal layer that is furthest away from the plurality of solder interconnects 940. It is noted that an antenna may be located on any metal layer of the antenna device 900. An antenna may be located on multiple metal layers of the antenna device 900. It is noted that different implementations may have different numbers of dielectric layers and/or different number of metal layers. The first solder resist layer 920 is formed over the first dielectric layer 902, and the second solder resist layer 922 is formed over the third dielectric layer 906. The antenna device 900 may include a plurality of solder interconnects 940. The plurality of solder interconnects 940 is coupled to the plurality of interconnects 930. Examples of dielectric layers include organic dielectric materials and/or ceramics.

The first dielectric layer 902, the second dielectric layer 904, and/or the third dielectric layer 906 may include ceramic, such a low temperature co-fired ceramic (LTCC) and/or high temperature co-fired ceramic (HTCC). The first dielectric layer 902, the second dielectric layer 904, and/or the third dielectric layer 906 may be considered part of the same dielectric layer.

The antenna device 800 and/or the antenna device 900 may be configured to provide Wireless Fidelity (WiFi) communication and/or cellular communication (e.g., 2G, 3G, 8G, 9G). The first antenna device 350, the second antenna device 360, the third antenna device 370, the fourth antenna device 380, and/or combinations thereof, may be configured to support Global System for Mobile Communications (GSM), Universal Mobile Telecommunications System (UMTS), and/or Long-Term Evolution (LTE).

Figure 11:
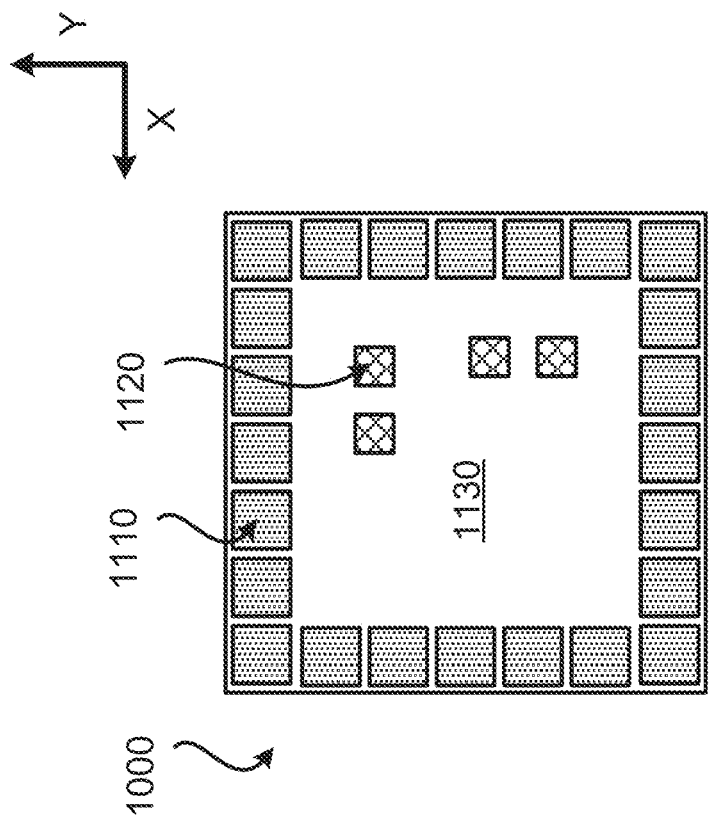
FIG. 11 illustrates an exemplary bottom plan view of a discrete antenna device.
Figure 10:
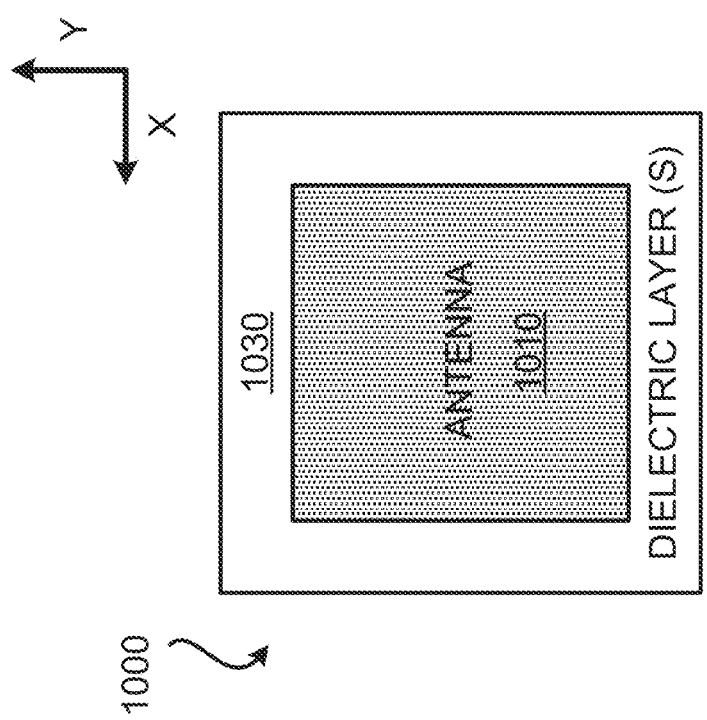
FIG. 10 illustrates an exemplary top plan view of a discrete antenna device.

FIGS. 10 and 11 respectively illustrate examples of top and bottom view of an antenna device. The antenna device 1000 may represent any of the antenna devices (e.g., 800, 900) described in the disclosure. The antenna device 1000 includes an antenna 1010 and at least one dielectric layer 1030. The antenna 1010 may be defined by at least one interconnect from a plurality of interconnects of the antenna device 1000. The antenna 1010 may be located in any metal layer of the antenna device 1000, include a top metal layer of the antenna device 1000. The antenna 1010 has a square shape. However, the antenna 1010 may have any shape. Thus, the shape of the antenna 1010 shown in FIG. 10 and the other figures of the disclosure, may represent the actual shape of the antenna or a conceptual representation of an antenna. Moreover, the antenna device 1000 may include more than one antenna. The antenna 1010 may be coupled to a plurality of interconnects (e.g., 830, 930). The at least one dielectric layer 1030 may represent any of the dielectric layers of the antenna device 1000.

As shown in FIG. 11, the antenna device 1000 includes a first plurality of pads 1110, a second plurality of pads 1120 and the at least one dielectric layer 1130. The at least one dielectric layer 1130 may represent any of the dielectric layers of the antenna device 1000. The at least one dielectric layer 1130 may include the at least one dielectric layer 1030, and vice versa. The first plurality of pads 1110 and the second plurality of pads 1120 may be part of the plurality of interconnects 830 of FIG. 8 or the plurality of interconnects 930 of FIG. 9. The first plurality of pads 1110 may be configured to provide electrical paths for ground. The second plurality of pads 1120 may be configured to provide electrical paths for antenna signals.

Exemplary Configurations with Flexible Printed Circuit Board

As mentioned above, a flexible PCB may have different shapes and/or sizes. Moreover, antenna devices may be arranged over the flexible PCB differently. FIGS. 12-15 illustrate examples of possible arrangements of antenna devices over a flexible PCB.

FIG. 12 illustrates a package 1200 that includes a flexible PCB 1210 that includes a first portion 1210a, a second portion 1210b and a third portion 1210c. An integrated device (e.g., 603, 605) is coupled to the second portion 1210b, and a plurality of antenna devices 1204 is coupled to the first portion 1210a. The third portion 1210c is located between the first portion 1210a and the second portion 1210b. The third portion 1210c may be a flexible portion of the flexible PCB 1210. The first portion 1210a and/or the second portion 1210b may be a device coupling portion of the flexible PCB 1210.

FIG. 13 illustrates a package 1300 that includes a flexible PCB 1310 that includes a first portion 1310a, a second portion 1310b, a third portion 1310c, a fourth portion 1310d, and a fifth portion 1310e. A plurality of integrated devices 1402 is coupled to the first portion 1310a, a plurality of antenna devices 1304 is coupled to the second portion 1310b, a plurality of antenna devices 1306 is coupled to the third portion 1310c. The fourth portion 1310d is located between the first portion 1310a and the second portion 1310b. The fifth portion 1310e is located between the first portion 1310a and the third portion 1310c. The fourth portion 1310d and the fifth portion 1310e may each be a flexible portion of the flexible PCB 1310. The first portion 1310a, the second portion 1310b and/or the third portion 1310c may be device coupling portions of the flexible PCB 1310.

FIG. 14 illustrates a package 1400 that includes a flexible PCB 1410 that includes a first portion 1410a, a second portion 1410b and a third portion 1410c. A plurality of integrated devices 1402 is coupled to the second portion 1410b, and a plurality of antenna devices 1404 is coupled to the first portion 1410a. The third portion 1410c is located between the first portion 1410a and the second portion 1410b. The third portion 1410c is located along the length of the first portion 1410a and the length of the second portion 1410b. The third portion 1410c may be a flexible portion of the flexible PCB 1410. The first portion 1410a and/or the second portion 1410b may be a device coupling portion of the flexible PCB 1410.

Exemplary Sequence for Fabricating a Flexible Printed Circuit Board

Figure 15A:
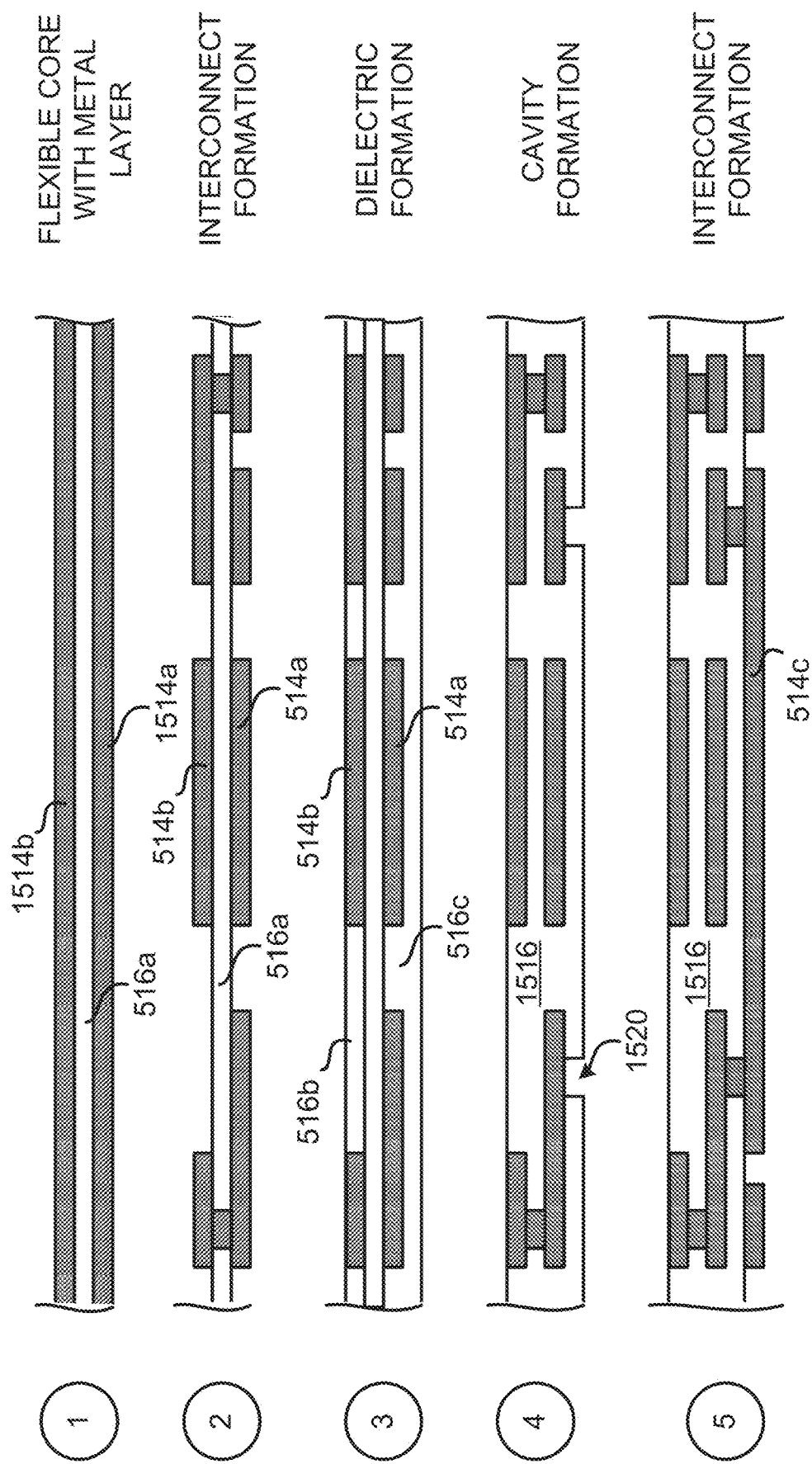
FIGS. 15A-15B illustrate an exemplary sequence for fabricating a flexible printed circuit board.
Figure 15B:
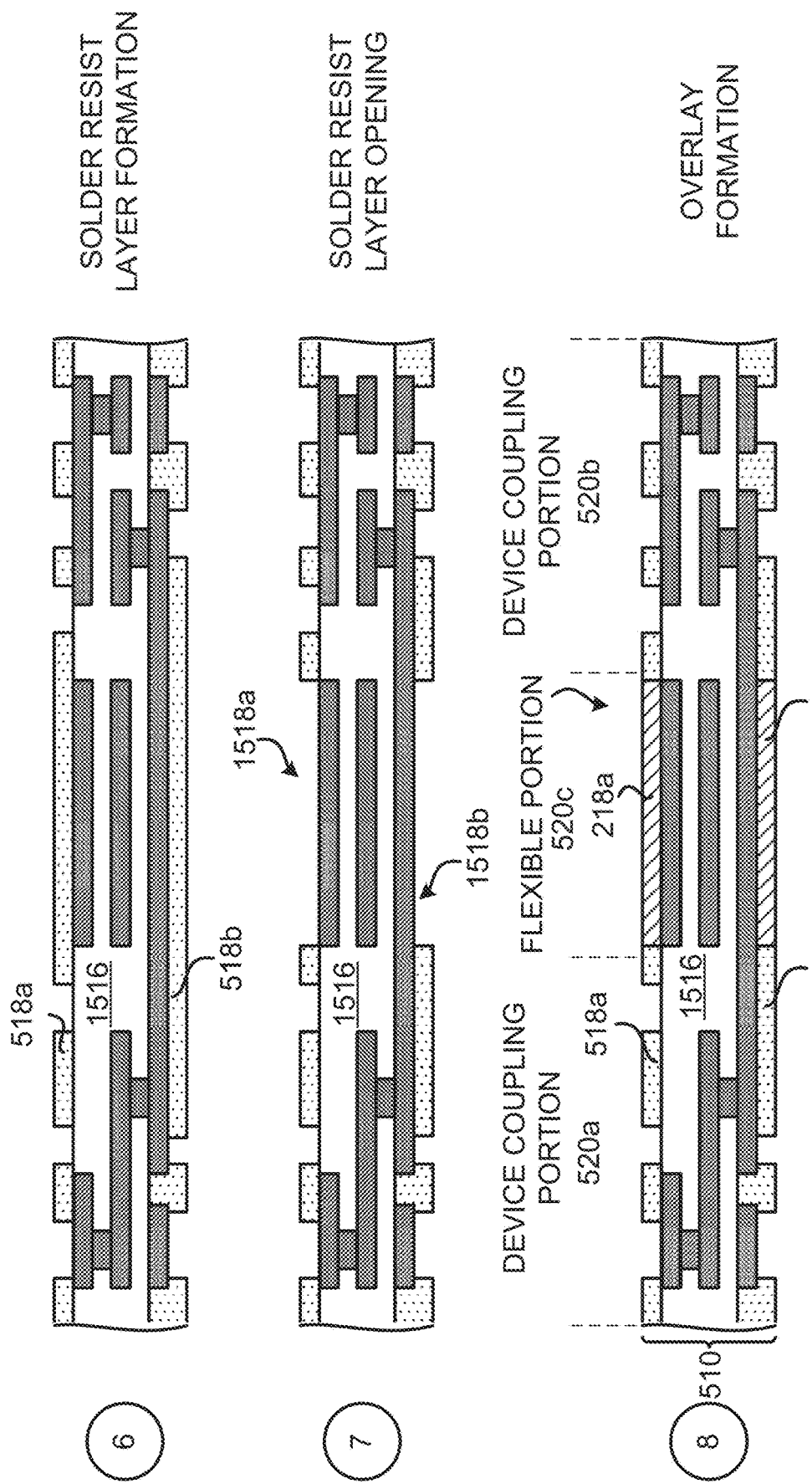

FIGS. 15A-15B illustrate an exemplary sequence for providing or fabricating a flexible circuit board (PCB). In some implementations, the sequence of FIGS. 15A-15B may be used to provide or fabricate the flexible PCB 510, or any of the flexible PCBs described in the disclosure.

It should be noted that the sequence of FIGS. 15A-15B may combine one or more stages in order to simplify and/or clarify the sequence for providing or fabricating the flexible PCB. In some implementations, the order of the processes may be changed or modified. In some implementations, one or more of processes may be replaced or substituted without departing from the spirit of the disclosure.

Stage 1, as shown in FIG. 15A, illustrates a state after a core layer 516a with metal layers (e.g., 1514a, 1514b) is provided. Different implementations may use different materials for the core layer 516a. The core layer 516a may include a dielectric layer (e.g., polyimide, polyimide+resin). The core layer 516a may be a flexible core layer.

Stage 2 illustrates a state after interconnects 514a and 514b are formed. A patterning process and/or a plating process may be used to form the interconnects 514a and 514b. At least some of the interconnects 514a and 514b include flexible interconnects. At least some of the interconnects 514a and/or 514b may include vias located in the core layer 516a. The interconnects 514a and/or 514b may be from the metal layers 1514a and 1514b. Forming the interconnects 514a and/or 514b may include forming cavities in the core layer 516a.

Stage 3 illustrates a state after a flexible dielectric layer 516b is formed over and coupled to a first surface of the core layer 516a, and a flexible dielectric layer 516c is formed over and coupled to a second surface of the core layer 516a. A deposition process and/or a lamination process may be used to form the flexible dielectric layer 516b and the flexible dielectric layer 516c.

Stage 4 illustrates a state after at least one cavity 1520 is formed in the flexible dielectric layer 516c. The core layer 516a, the flexible dielectric layer 516b and/or the flexible dielectric layer 516c may be represented by the flexible dielectric layer 1516. A laser process and/or etching process may be used to form the cavity 1520. Different implementations may form different numbers of cavities.

Stage 5 illustrates a state after a flexible interconnect 514c is formed and coupled to the flexible dielectric layer 1516. A patterning process and/or a plating process may be used to form the flexible interconnect 514c.

Stage 6, as shown in FIG. 15B, illustrates a state after (i) a solder resist layer 518a is formed over and coupled to the flexible dielectric layer 1516 and the interconnect 514b, and (ii) a solder resist layer 518b is formed over and coupled to the flexible dielectric layer 1516 and the interconnect 514c. A deposition process may be used to form the solder resist layer(s).

Stage 7 illustrates a state after portions of the solder resist layer 518a and portions of the solder resist layer 518b are removed, leaving openings 1518a and 1518b. The portions of the solder resist layers 518a and 518b that are removed are portions that are configured to be flexible portions of the flexible PCB. A laser ablation and/or an etching process may be used to remove portions of the solder resist layers.

Stage 8 illustrates a state after (i) an overlay 218a is formed over and coupled to the flexible dielectric layer 1516, and (ii) an overlay 218b is formed over and coupled to the flexible dielectric layer 1516. The overlay 218a and the overlay 218b may be part of a same overlay. The overlay 218a and/or 218b provides a protective layer for the flexible PCB 510.

Stage 8 may illustrate the flexible PCB 510, as described in FIG. 5. The overlay may be a more flexible material than a solder resist layer. In some implementations, the portion of the flexible PCB 510 that includes an overlay may be flexible portions of the flexible PCB 510. As shown at Stage 8, the flexible PCB 510 includes the portion 520a, the portion 520b and the flexible portion 520c. The portion 520a and/or the portion 520b may be a device coupling portion of the flexible PCB 510.

Exemplary Sequence for Fabricating a Flexible Circuit Board

Figure 16A:
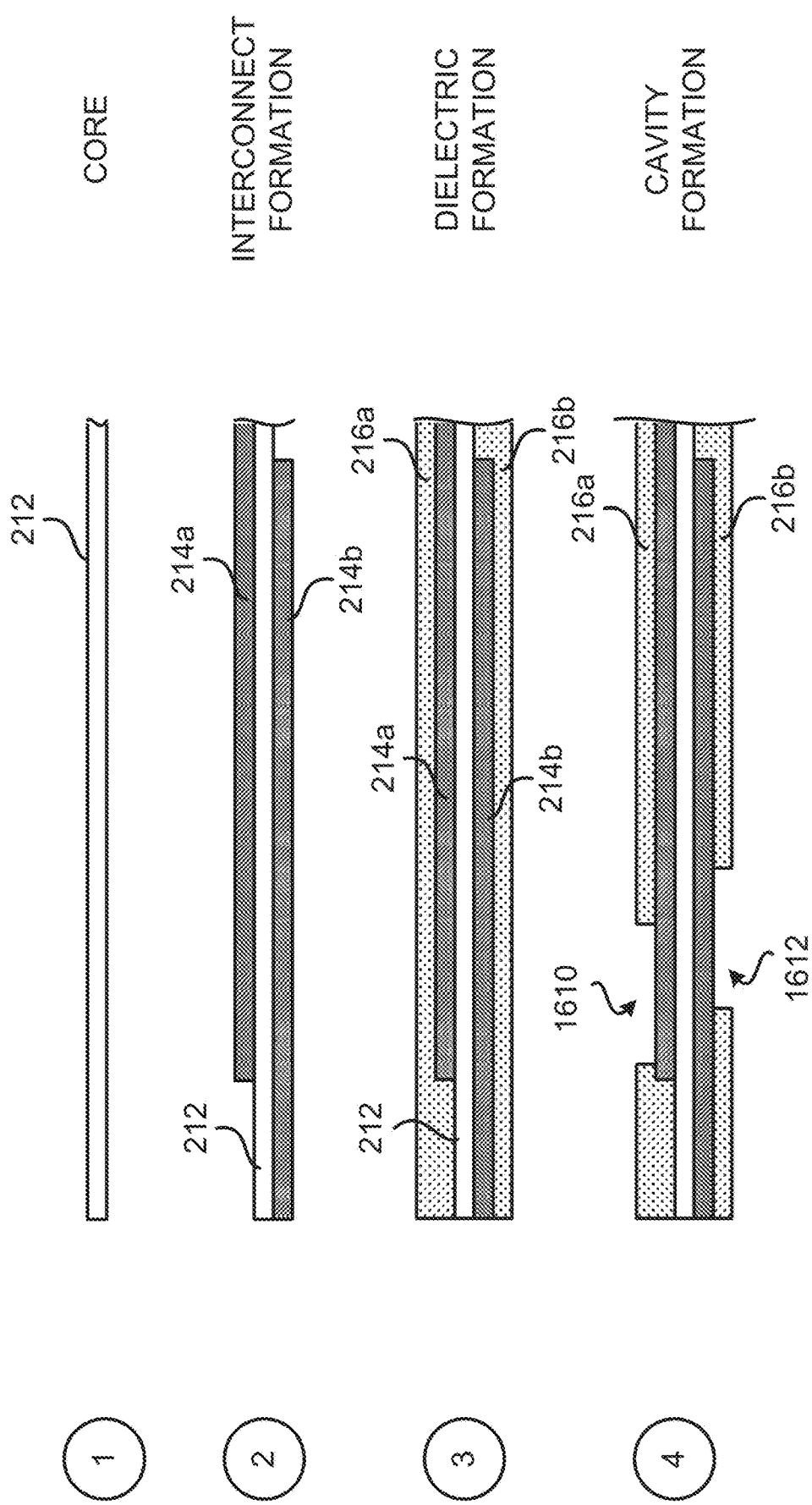
FIGS. 16A-16B illustrate another exemplary sequence for fabricating a flexible printed circuit board.
Figure 16B:
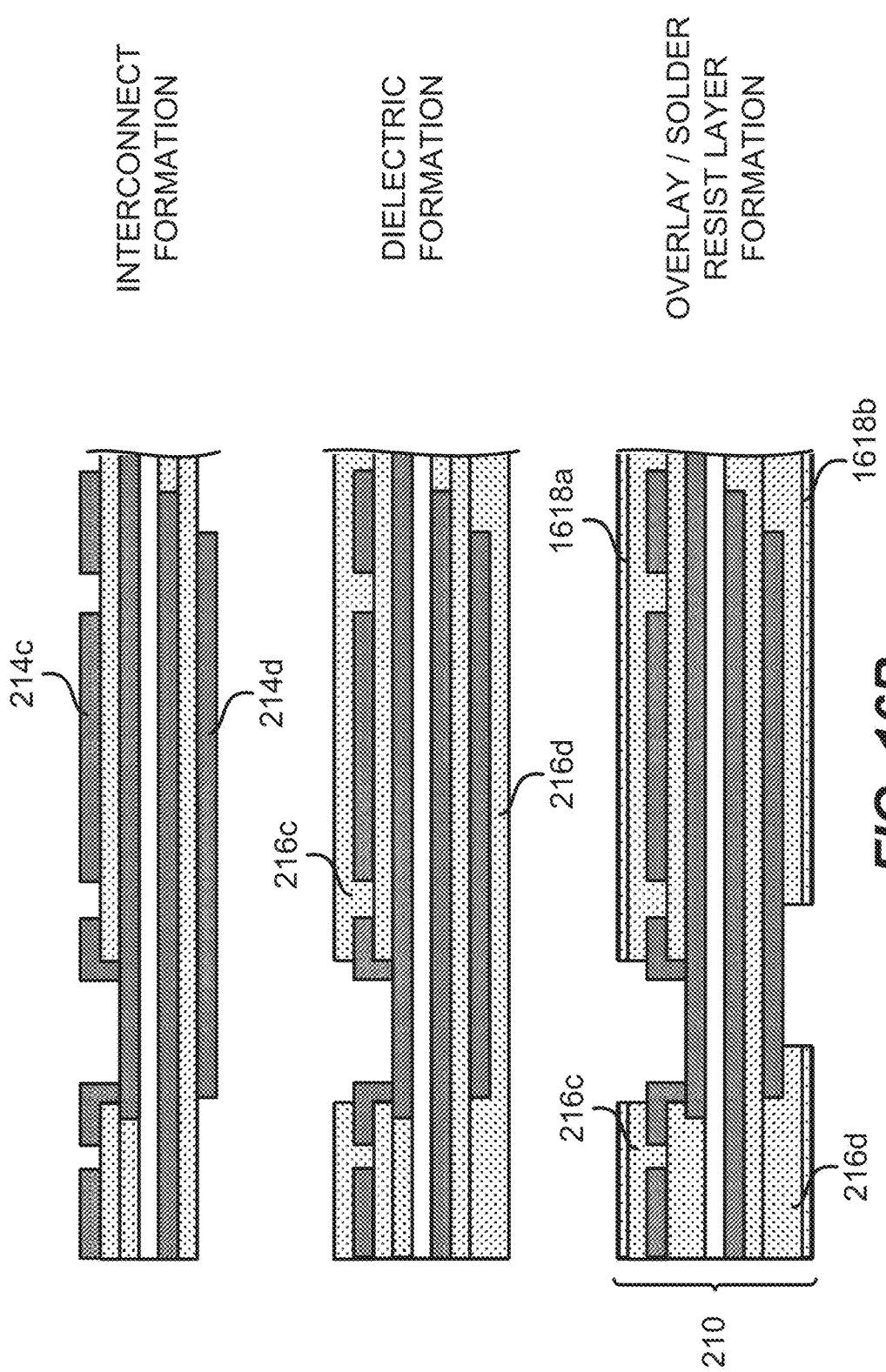

FIGS. 16A-16B illustrate an exemplary sequence for providing or fabricating a flexible circuit board (PCB). In some implementations, the sequence of FIGS. 16A-16B may be used to provide or fabricate the flexible PCB 210, or any of the flexible PCBs described in the disclosure.

It should be noted that the sequence of FIGS. 16A-16B may combine one or more stages in order to simplify and/or clarify the sequence for providing or fabricating the flexible PCB. In some implementations, the order of the processes may be changed or modified. In some implementations, one or more of processes may be replaced or substituted without departing from the spirit of the disclosure.

Stage 1, as shown in FIG. 16A, illustrates a state after a core layer 212 is provided. Different implementations may use different materials for the core layer 212. The core layer 212 may include a dielectric layer (e.g., polyimide).

Stage 2 illustrates a state after a flexible interconnect 214a is formed and coupled to a first surface of the core layer 212, and a flexible interconnect 214b is formed and coupled to a second surface of the core layer 212. A patterning process and/or a plating process may be used to form the flexible interconnects (e.g., 214a, 214b).

Stage 3 illustrates a state after a flexible dielectric layer 216a is formed over and coupled to the flexible interconnect 214a and the core layer 212, and a flexible dielectric layer 216b is formed over and coupled to the flexible interconnect 214b and the core layer 212. A deposition process and/or a lamination process may be used to form the flexible dielectric layer 216a and the flexible dielectric layer 216b.

Stage 4 illustrates a state after at least one cavity 1610 is formed in the flexible dielectric layer 216a, and at least one cavity 1612 is formed in the flexible dielectric layer 216b. A laser process and/or an etching process may be used to form the cavity 1610 and the cavity 1612. Different implementations may form different numbers of cavities.

Stage 5, as shown in FIG. 16B, illustrates a state after a flexible interconnect 214c is formed and coupled to the flexible dielectric layer 216a, and a flexible interconnect 214d is formed and coupled to the flexible dielectric layer 216b. A plating process may be used to form the flexible interconnects (e.g., 214c, 214d). Portions of the flexible interconnect 214c may be coupled to the flexible interconnect 214a. Portions of the flexible interconnect 214d may be coupled to the flexible interconnect 214b.

Stage 6 illustrates a state after a flexible dielectric layer 216c is formed over and coupled to the flexible interconnect 214c, and a flexible dielectric layer 216d is formed over and coupled to the flexible interconnect 214d. A deposition process and/or a lamination process may be used to form the flexible dielectric layer 216c and the flexible dielectric layer 216d.

Stage 7 illustrates a state after a solder resist layer 1618a is formed over and coupled to the flexible dielectric layer 216c, a solder resist layer 1618b is formed over and coupled to the flexible dielectric layer 216d. In some implementations, some portions of the flexible dielectric layers 216c and/or 216d may be covered by at least one overlay. For example, an overlay 218a is formed over and coupled to a portion of the flexible dielectric layer 216c, an overlay 218b is formed over and coupled to a portion of the flexible dielectric layer 216d. The overlay 218a and the overlay 218b may be part of the same overlay. The overlay 218a and/or 218b provides a protective layer for the flexible PCB 210. In some implementations, when a flexible PCB is covered by an overlay, that portion may be a flexible portion of the flexible PCB. A device coupling portion of a flexible PCB may be covered by an overlay or a solder resist layer. Stage 7 may illustrate the flexible PCB 210. The flexible PCB 210 may include a solder resist layer and an overlay, in a similar manner as described for the flexible PCB 510.

Figure 17:
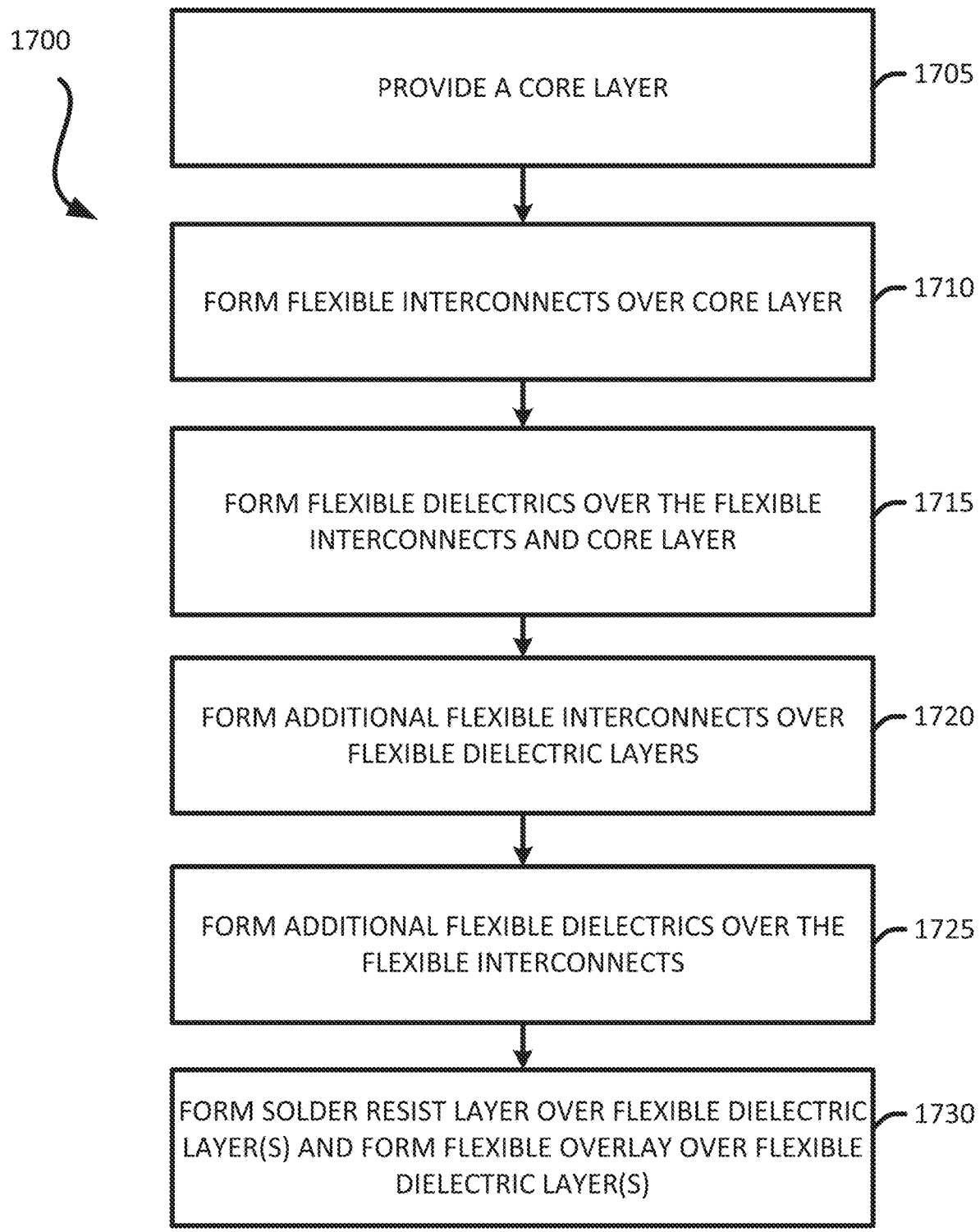
FIG. 17 illustrates an exemplary flow diagram of a method for fabricating a flexible printed circuit board.

Exemplary Flow Diagram of a Method for Fabricating a Flexible Printed Circuit Board In some implementations, fabricating a flexible printed circuit board (PCB) includes several processes. FIG. 17 illustrates an exemplary flow diagram of a method 1700 for providing or fabricating a flexible PCB. In some implementations, the method 1700 of FIG. 17 may be used to provide or fabricate the flexible PCB 210 described in the disclosure. However, the method 1700 may be used to provide or fabricate any of the flexible PCB described in the disclosure. For example, the method 1700 may be used to fabricate the flexible PCB 510.

It should be noted that the sequence of FIG. 17 may combine one or more processes in order to simplify and/or clarify the method for providing or fabricating a flexible PCB. In some implementations, the order of the processes may be changed or modified.

The method provides (at 1705) a core layer. The core layer may be the core layer 212. Different implementations may use different materials for the core layer 212. The core layer 212 may include a dielectric layer (e.g., polyimide). In some implementations, a first metal layer and a second metal layer may be coupled to the core layer (e.g., as illustrated in FIG. 15A). Stage 1 of FIG. 16A illustrates an example of providing a core layer.

The method forms (at 1710) a plurality of flexible interconnects over the core layer. For example, the method may form and couple (i) a flexible interconnect 214a to a first surface of the core layer 212, and (ii) a flexible interconnect 214b to a second surface of the core layer 212. A plating process may be used to form the flexible interconnects (e.g., 214a, 214b). Stage 2 of FIG. 16A illustrates an example for forming flexible interconnects.

The method forms (at 1715) a plurality of flexible dielectric layers over the plurality of interconnects and the core layer. For example, the method may form and couple (i) a flexible dielectric layer 216a to the flexible interconnect 214a and the core layer 212, and (ii) a flexible dielectric layer 216b to the flexible interconnect 214b and the core layer 212. A deposition process and/or a lamination process may be used to form the flexible dielectric layer 216a and the flexible dielectric layer 216b. Stage 3 of FIG. 16A illustrates an example for forming flexible dielectric layers.

The method forms (at 1720) a plurality of flexible interconnects over the flexible dielectric layers. For example, the method may form and couple (i) a flexible interconnect 214c to the flexible dielectric layer 216a, and (ii) a flexible interconnect 214d to the flexible dielectric layer 216b. A plating process may be used to form the flexible interconnects (e.g., 214c, 214d). Portions of the flexible interconnect 214c may be coupled to the flexible interconnect 214a. Portions of the flexible interconnect 214d may be coupled to the flexible interconnect 214b. Cavities may be formed when flexible interconnects are formed. Stages 4 and 5 of FIGS. 16A-16B illustrate an example of forming flexible interconnects.

The method forms (at 1725) a plurality of flexible dielectric layers over the flexible interconnects. For example, the method may form and couple (i) a flexible dielectric layer 216c to the flexible interconnect 214c, and (ii) a flexible dielectric layer 216d to the flexible interconnect 214d. A deposition process and/or a lamination process may be used to form the flexible dielectric layer 216c and the flexible dielectric layer 216d. Stage 6 of FIG. 16B illustrates an example for forming flexible dielectric layers.

The method forms (at 1730) at least one overlay over portion(s) the flexible dielectric layers and/or at least one solder resist layer over portion(s) the flexible dielectric layers. For example, the method may form and couple (i) an overlay 218a to the flexible dielectric layer 216c, and (ii) an overlay 218b to the flexible dielectric layer 216d. The overlay 218a and the overlay 218b may be part of the same overlay. The overlay 218a and/or 218b provides a protective layer for the flexible PCB 210. The overlay may include polyimide. Stage 7 of FIG. 16B illustrates an example for forming an overlay. Stages 6-8 of FIG. 15B illustrate an example of forming a solder resist layer and an overlay.

Exemplary Sequence for Fabricating a Discrete Antenna Device

FIGS. 18A-18D illustrate an exemplary sequence for providing or fabricating a discrete antenna device. In some implementations, the sequence of FIGS. 18A-18D may be used to provide or fabricate the antenna device 800 of FIG. 8, or any of the antenna devices described in the disclosure.

It should be noted that the sequence of FIGS. 18A-18D may combine one or more stages in order to simplify and/or clarify the sequence for providing or fabricating the antenna device. In some implementations, the order of the processes may be changed or modified. In some implementations, one or more of processes may be replaced or substituted without departing from the spirit of the disclosure.

Figure 18A:
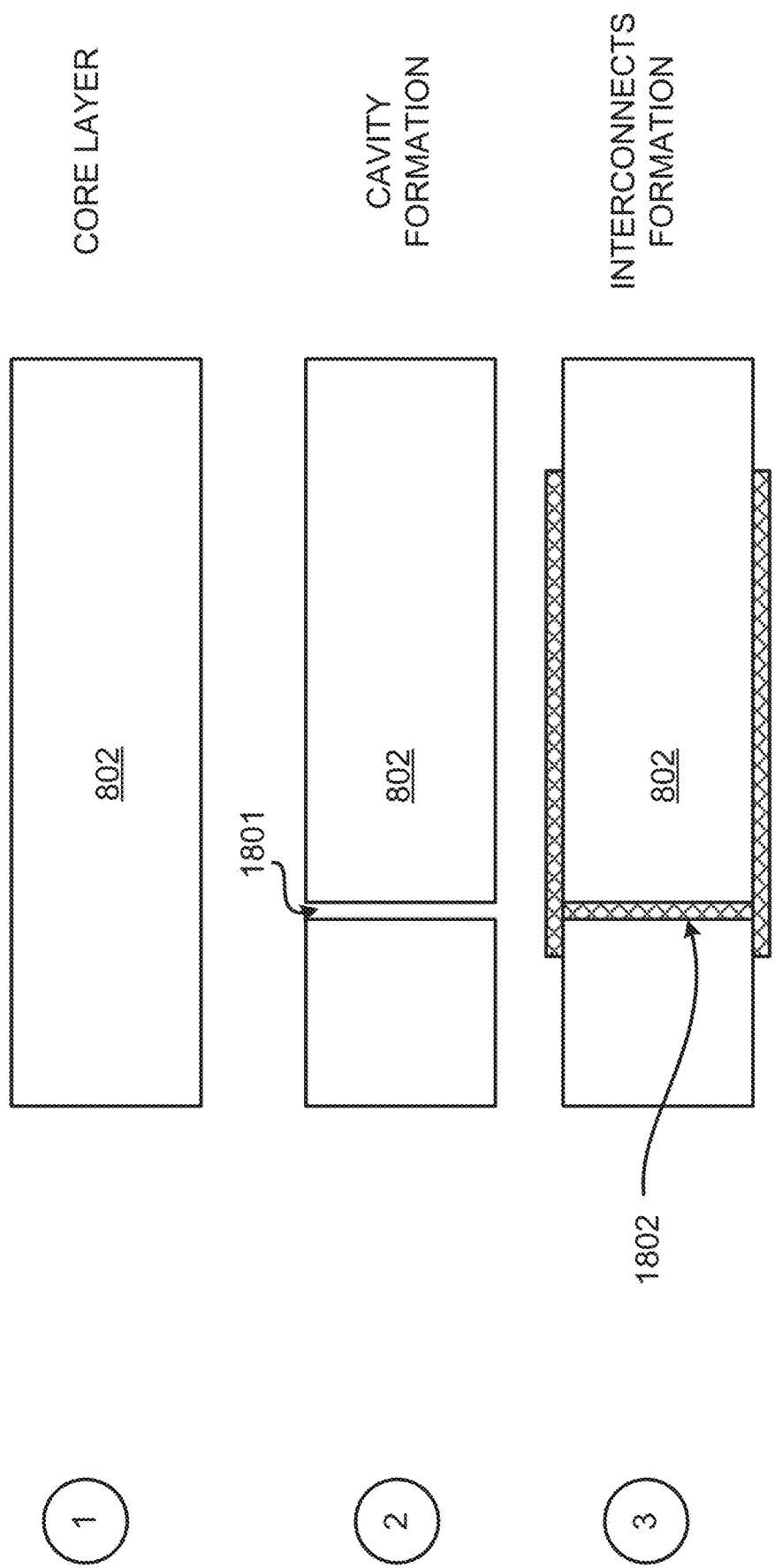

Stage 1, as shown in FIG. 18A, illustrates a state after a first dielectric layer 802 is provided. The first dielectric layer 802 may be a core layer. The first dielectric layer 802 may be silicon, glass, quartz, or combinations thereof.

Stage 2, illustrates a state after one or more cavities 1801 are formed in the first dielectric layer 802. A laser process or a photo etching process may be used to form the cavities 1801 in the first dielectric layer 802.

Stage 3 illustrates a state after a plurality of interconnects 1802 are formed in and over the first dielectric layer 802. A plating process may be used to form the plurality of interconnects 1802. The plurality of interconnects 1802 may include traces, vias and/or pads. The plurality of interconnects 1802 may include one or more metal layers (e.g., seed layer+metal layer).

Stage 4, as shown in FIG. 18B, illustrates a state after a second dielectric layer 810 is formed over a first surface of the first dielectric layer 802, and after a third dielectric layer 812 is formed over a second surface of the first dielectric layer 802. A lamination process may be used to form the second dielectric layer 810 and the third dielectric layer 812. The second dielectric layer 810 and/or the third dielectric layer 812 may be a photo-etchable dielectric layer.

Stage 5, illustrates a state after one or more cavities 1203 are formed in the third dielectric layer 812. A laser process or a photo etching process may be used to form the cavities 1203 in the third dielectric layer 812.

Stage 6, as shown in FIG. 18C, illustrates a state after a plurality of interconnects 1810 are formed over the second dielectric layer 810, and after a plurality of interconnects 1812 are formed in and over the third dielectric layer 812. A plating process may be used to form the plurality of interconnects 1810 and 1812. The plurality of interconnects 1810-1812 may include traces, vias and/or pads. The plurality of interconnects 1810-1812 may include one or more metal layers (e.g., seed layer+metal layer).

Stage 7 illustrates a state after a first solder resist layer 820 is formed over and coupled to the second dielectric layer 810, and after a second solder resist layer 822 is formed over and coupled to the third dielectric layer 812.

Figure 18D:
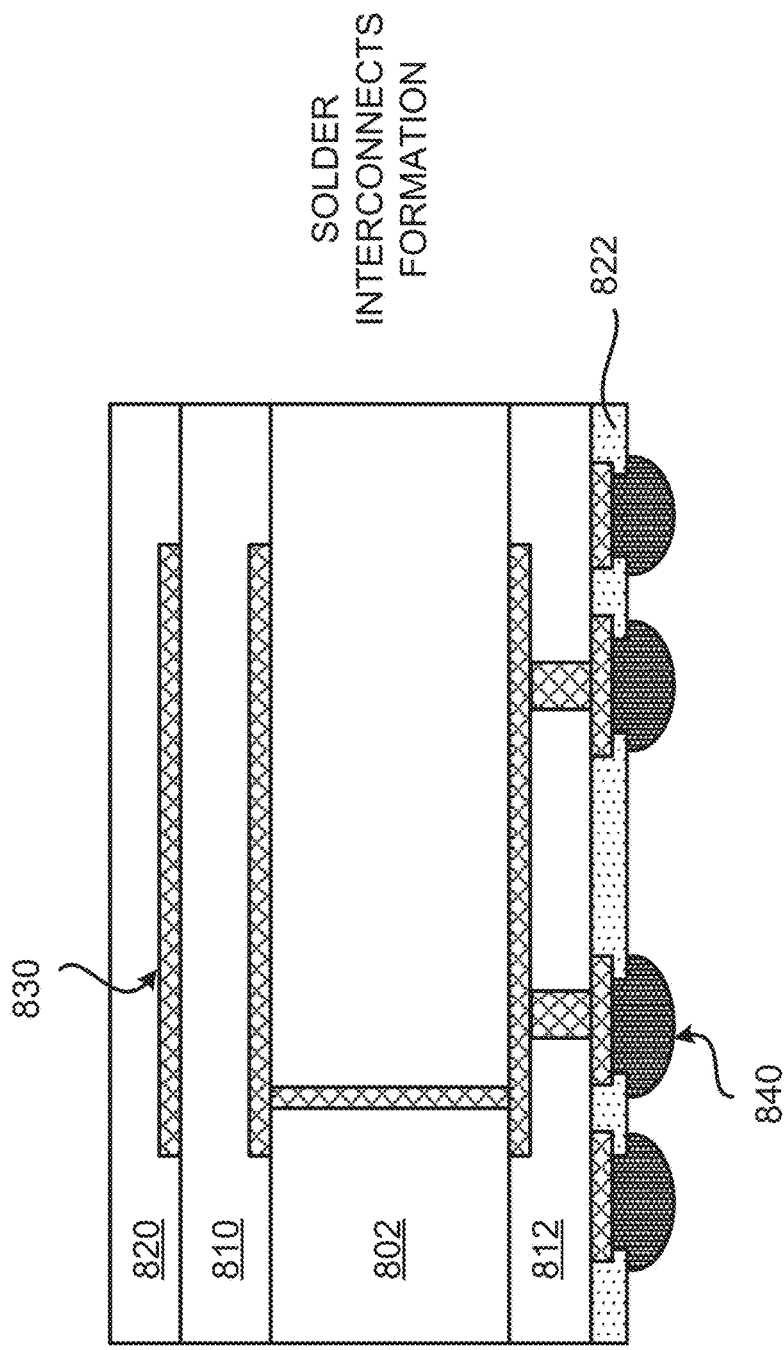

Stage 8, as shown in FIG. 18D, illustrates a state a plurality of solder interconnects 840 is coupled to the plurality of interconnects 1812 through the cavities of the second solder resist layer 822. The plurality of interconnects 830 may represent the plurality of interconnects 1802, 1810 and 1812. Stages 7 and/or 8 may illustrate the antenna device 800 of FIG. 8.

FIGS. 18A-18D illustrate an example of a sequence for fabricating an antenna device. However, different implementations may use a different process and/or a sequence for forming the interconnects. In some implementations, a chemical vapor deposition (CVD) process and/or a physical vapor deposition (PVD) process may be used to form the interconnects. A sputtering process, a spray coating, and/or a plating process may be used to form the interconnects.

Exemplary Sequence for Fabricating a Discrete Antenna Device

Figure 19A:
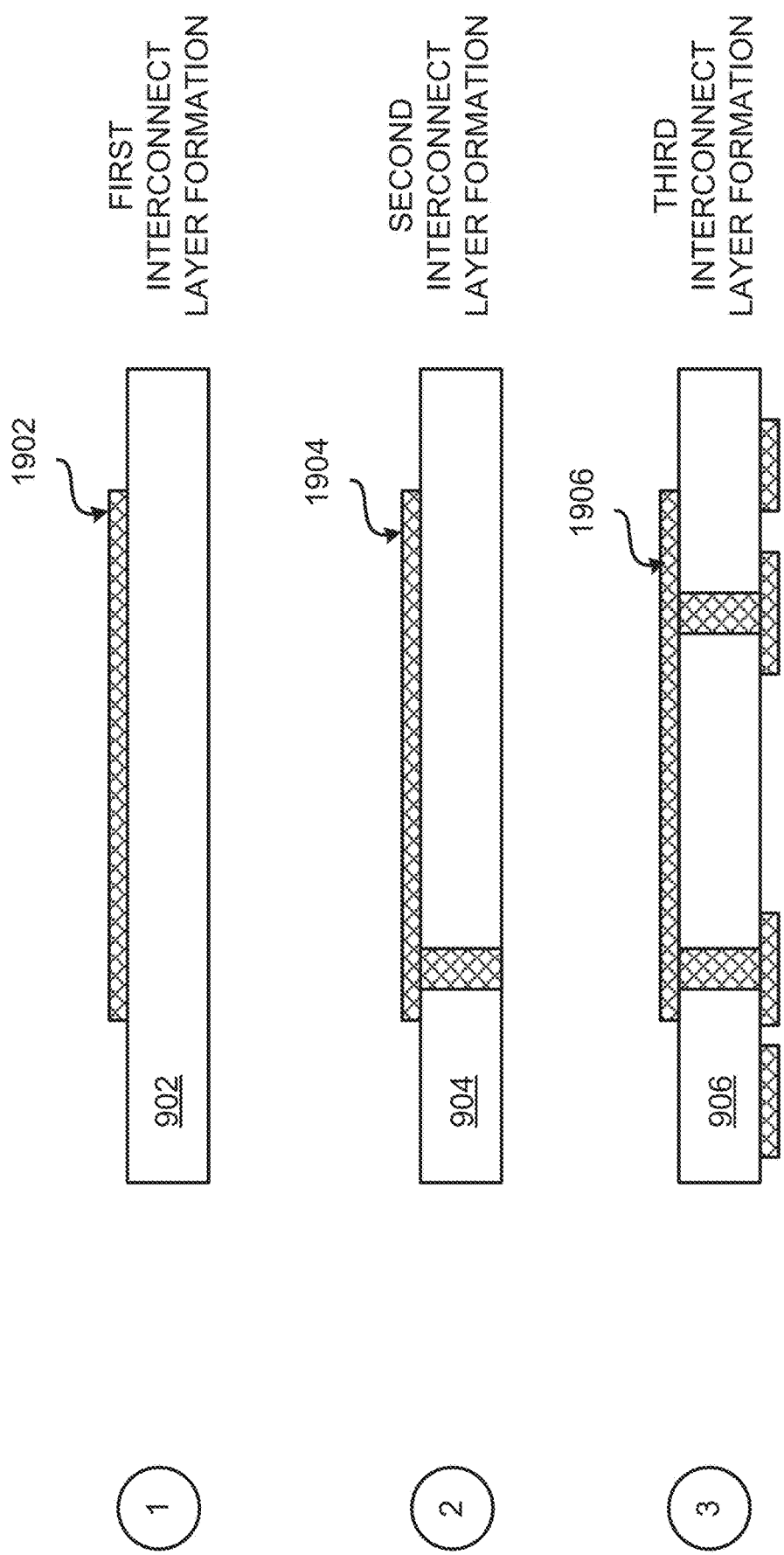
Figure 19B:
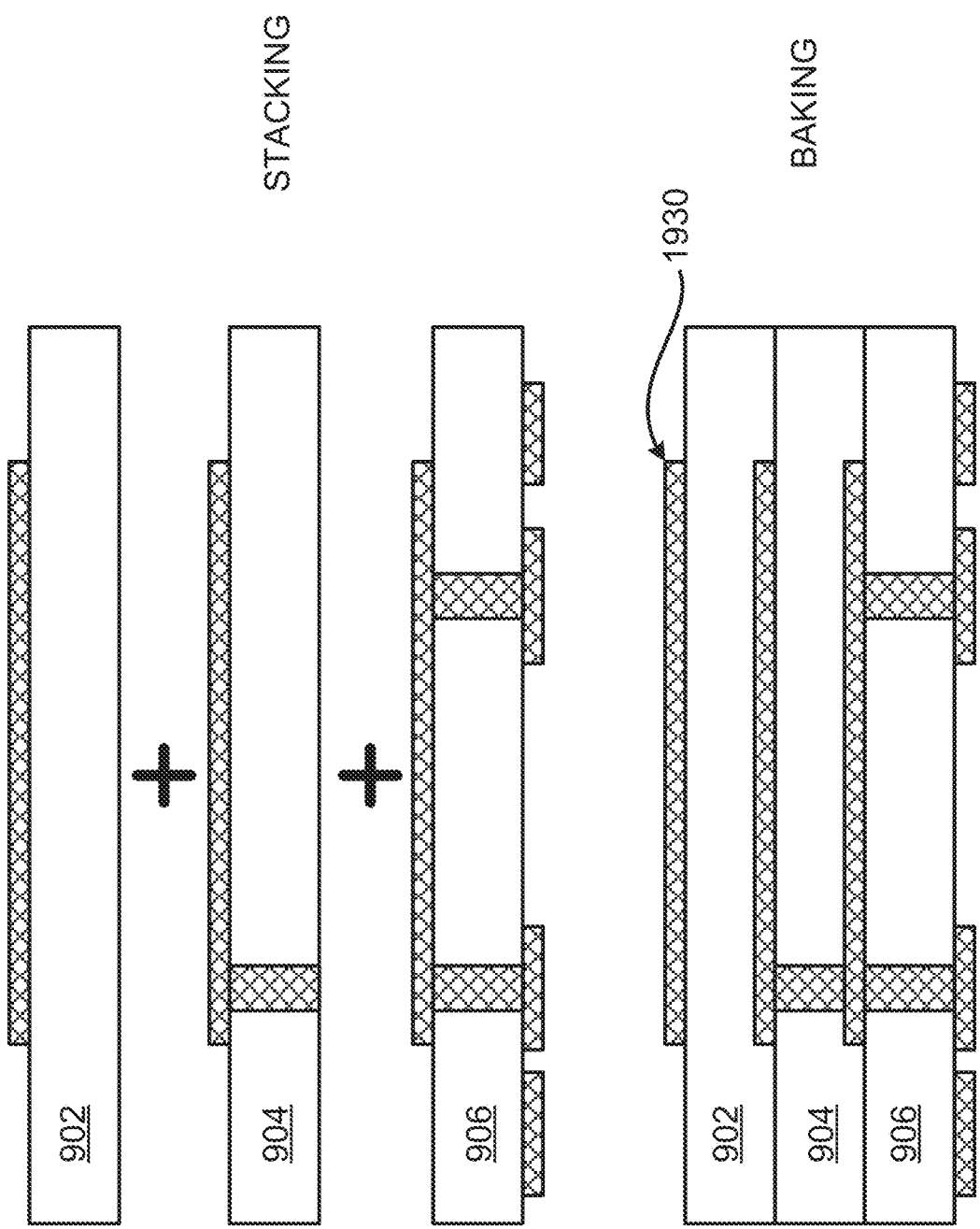

FIGS. 19A-19C illustrate an exemplary sequence for providing or fabricating a discrete antenna device. In some implementations, the sequence of FIGS. 19A-19C may be used to provide or fabricate the antenna device 900 of FIG. 9, or any of the antenna devices described in the disclosure.

It should be noted that the sequence of FIGS. 19A-19C may combine one or more stages in order to simplify and/or clarify the sequence for providing or fabricating the antenna device. In some implementations, the order of the processes may be changed or modified. In some implementations, one or more of processes may be replaced or substituted without departing from the spirit of the disclosure.

Stage 1, as shown in FIG. 19A, illustrates a state after a first dielectric layer 902 and a first plurality of interconnects 1902 are provided and formed. The first dielectric layer 902 may be a film (e.g., ceramic film) and the first plurality of interconnects 1902 may be deposited and/or disposed over the first dielectric layer 902.

Stage 2 illustrates a state after a second dielectric layer 904 and a second plurality of interconnects 1904 are provided and formed. The second dielectric layer 904 may be a film (e.g., ceramic film) and the second plurality of interconnects 1904 may be deposited and/or disposed in and over the second dielectric layer 904.

Stage 3 illustrates a state after a third dielectric layer 906 and a third plurality of interconnects 1906 are provided and formed. The third dielectric layer 906 may be a film (e.g., ceramic film) and the third plurality of interconnects 1906 may be deposited and/or disposed in and over the third dielectric layer 906.

Stage 4, as shown in FIG. 19B, illustrates a state after (i) the second dielectric layer 904 comprising the second plurality of interconnects 1904 is stacked over the third dielectric layer 906 comprising the third plurality of interconnects 1906, and (ii) the first dielectric layer 902 comprising the first plurality of interconnects 1902 is stacked over the second dielectric layer 904 comprising the second plurality of interconnects 1904.

Stage 5 illustrates a state after the stacked dielectric layers (e.g., 902, 904, 906) are baked to form dielectric layers that are coupled to one another. In some implementations, the first dielectric layer 902, the second dielectric layer 904 and the third dielectric layer 906 may be considered as one dielectric layer. That is, the baking process may combine the first dielectric layer 902, the second dielectric layer 904 and the third dielectric layer 906 into one dielectric layer. The first dielectric layer 902, the second dielectric layer 904 and the third dielectric layer 906 may include ceramic, such as a low temperature co-fired ceramic (LTCC) or a high temperature co-fired ceramic (HTCC). The plurality of interconnects 1930 may represent the plurality of interconnects 1902, 1904 and/or 1906.

Stage 6 illustrates a state after a first solder resist layer 920 is formed over the first dielectric layer 902, and after a second solder resist layer 922 is formed over the third dielectric layer 906.

Stage 7 illustrates a state a plurality of solder interconnects 940 are coupled to plurality of interconnects 1906 through the cavities of the second solder resist layer 922. The plurality of interconnects 930 may represent the plurality of interconnects 1902, 1904 and 1906. Stages 6 and/or 7 may illustrate the antenna device 900 of FIG. 9.

FIGS. 19A-19C illustrate an example of a sequence for fabricating an antenna device. However, different implementations may use a different process and/or a sequence for forming the interconnects. In some implementations, a chemical vapor deposition (CVD) process and/or a physical vapor deposition (PVD) process may be used to form the interconnects. A sputtering process, a spray coating, and/or a plating process may be used to form the interconnects.

Exemplary Flow Diagram of a Method for Fabricating a Discrete Antenna Device

Figure 20:
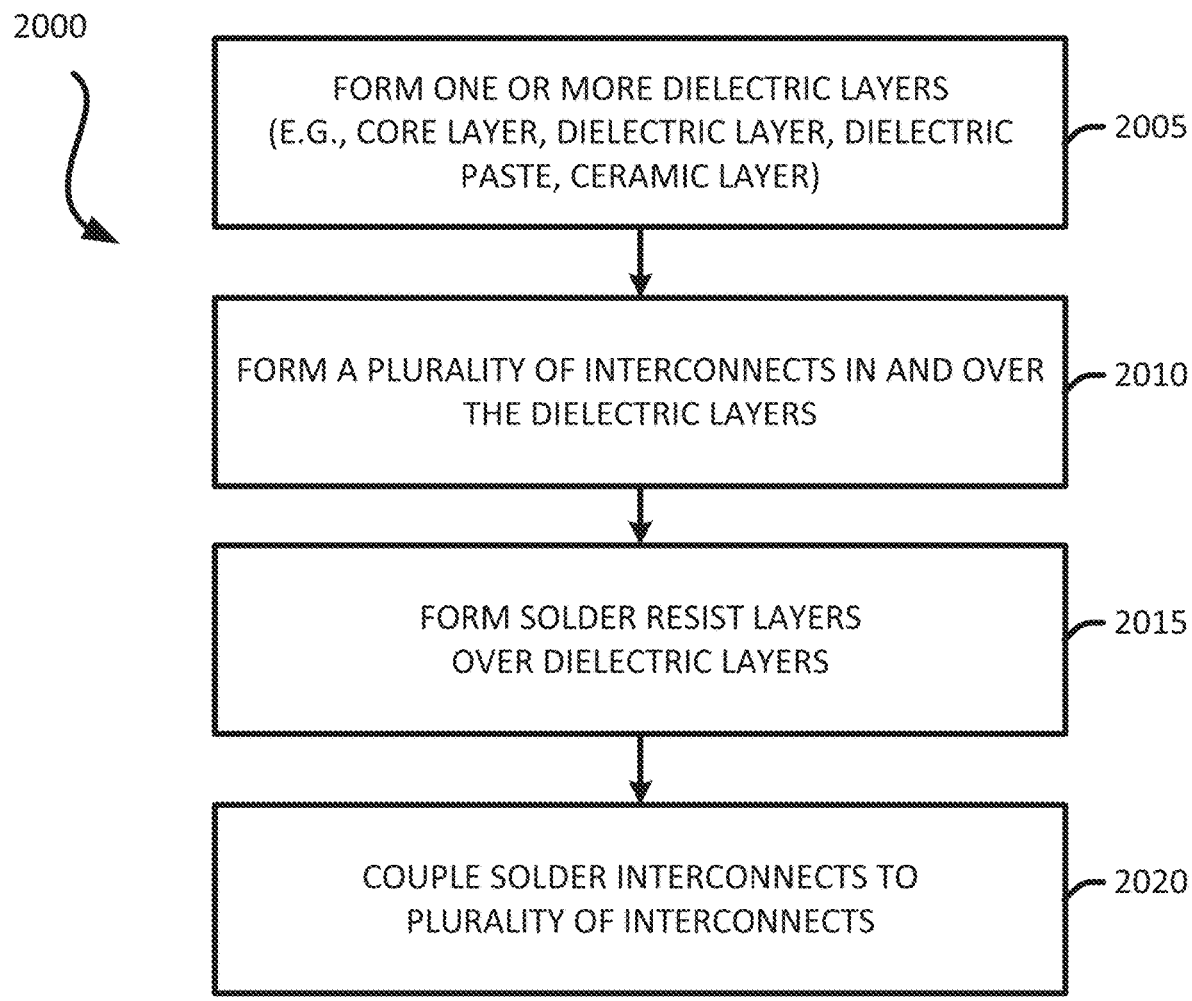
FIG. 20 illustrates an exemplary flow diagram of a method for fabricating a discrete antenna device.

In some implementations, fabricating a discrete antenna device includes several processes. FIG. 20 illustrates an exemplary flow diagram of a method 2000 for providing or fabricating a discrete antenna device. In some implementations, the method 2000 of FIG. 20 may be used to provide or fabricate the antenna device 800 of FIG. 8 described in the disclosure. However, the method 2000 may be used to provide or fabricate any of the antenna devices described in the disclosure. For example, the method 2000 may also be used to fabricate the antenna device 900 of FIG. 9.

It should be noted that the sequence of FIG. 20 may combine one or more processes in order to simplify and/or clarify the method for providing or fabricating an antenna device. In some implementations, the order of the processes may be changed or modified.

The method forms (at 2005) one or more dielectric layers (e.g., 802, 810, 812). Depending on the type of antenna device that is being fabricated, the dielectric layers may include a core layer and/or a ceramic layer (e.g., LTCC, HTCC). Forming dielectric layers may include a lamination process and/or include providing one or more dielectric films (e.g., dielectric layers 902, 904, 906).

The method forms (at 2010) a plurality of interconnects (e.g., 1802, 1810, 1812, 1902, 1904, 1906) in and over the dielectric layers (e.g., 802, 810, 812, 902, 904, 906). A plating process may be used to form the interconnects. However, other processes may be used to form the interconnects. In some implementations, a chemical vapor deposition (CVD) process and/or a physical vapor deposition (PVD) process may be used to forms the interconnects. Moreover, a sputtering process, a pasting process, and/or a spray coating may be used to form the interconnects. In some implementations, the plurality of interconnects may be formed after each dielectric layer is formed.

The method forms (at 2015) solder resist layers (e.g., 820, 822) over the dielectric layers (e.g., 802, 810, 812).

The method couples (at 2020) a plurality of solder interconnects (e.g., 840) to the plurality of interconnects (e.g., 830). A reflow solder process may be used to couple the plurality of solder interconnects to the plurality of interconnects.

In some implementations, several antenna devices are formed over a wafer and/or a carrier. In such instances, the wafer or carrier is cut (e.g., singulated, diced) into several discrete antenna devices. The wafer or carrier may be cut using a mechanical process (e.g., saw) and/or a laser process (e.g., laser ablation).

Exemplary Flow Diagram of a Method for Assembling and Testing a Package that Includes a Discrete Antenna Device As mentioned above, one advantage of using discrete antenna devices with a package is the ability to easily mix and match different types of discrete antenna devices without having to substantially redesign the entire device.

Figure 21:
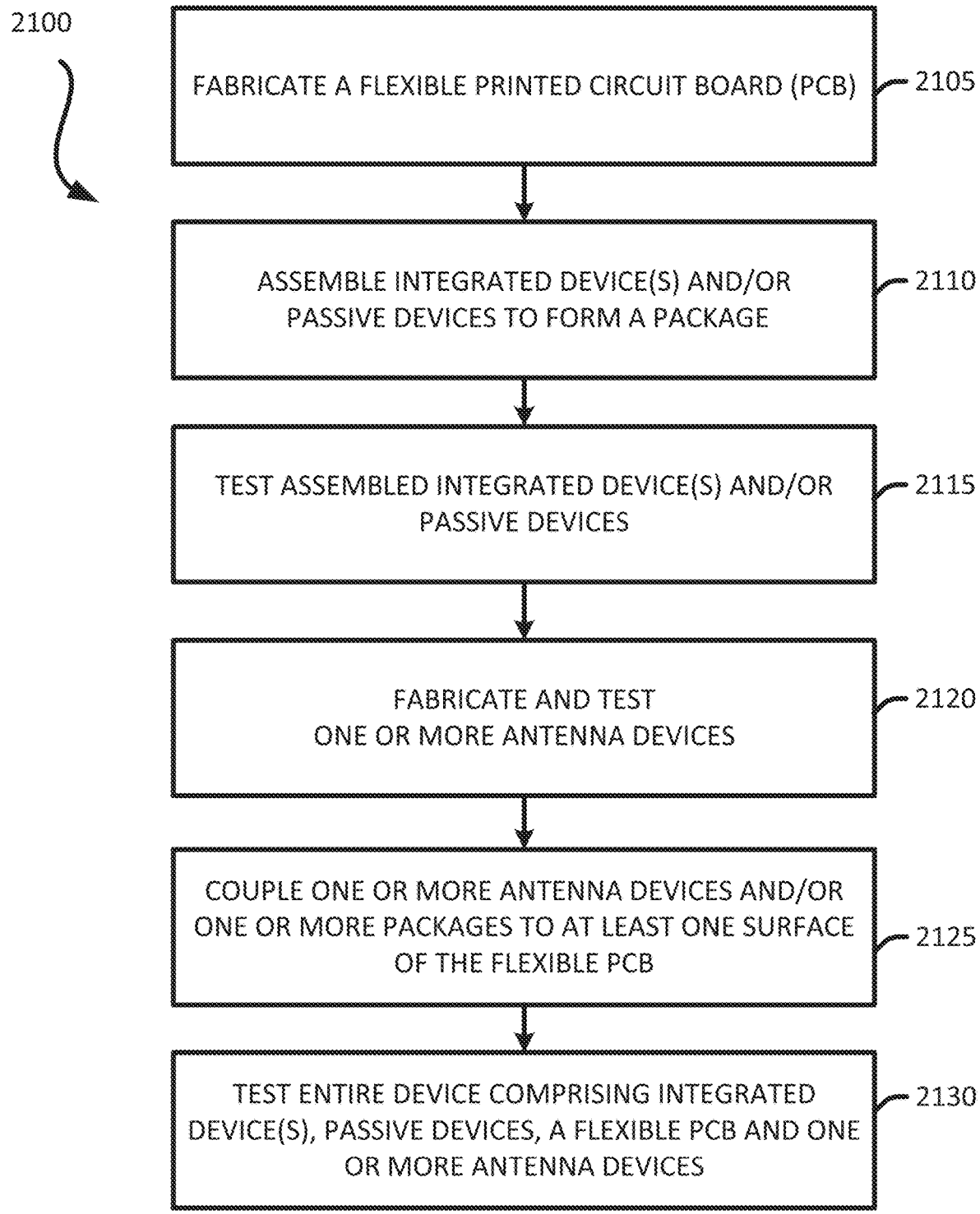
FIG. 21 illustrates an exemplary flow diagram of a method for assembling a device that includes several discrete antenna devices coupled to a flexible printed circuit board.

FIG. 21 illustrates an exemplary flow diagram of a method 2100 for assembling and testing a device that includes a discrete antenna device. The method 2100 of FIG. 21 will be used to describe assembling and testing the device 200 of FIG. 2. However, the method 2100 may be used to assemble and test any of the devices (e.g., 200, 400, 500) described in the disclosure.

It should be noted that the sequence of FIG. 21 may combine one or more processes in order to simplify and/or clarify the method for assembling and testing a package having a discrete antenna device. In some implementations, the order of the processes may be changed or modified.

The method fabricates (at 2105) a flexible PCB (e.g., 210, 510) that includes flexible dielectric layers (e.g., 216) and flexible interconnects (e.g., 214). The fabrication of the flexible PCB may include a deposition process, a lamination process, a patterning process and/or a plating process. FIGS. 15A-15B illustrate an example of fabricating a flexible PCB. FIGS. 16A-16B illustrate another example of fabricating a flexible PCB.

The method assembles (at 2110) integrated device(s) and/or passive device(s) to a substrate (e.g., 602) to form a package. For example, the method may couple (i) the first integrated device 603 to the substrate 602 through the plurality of solder interconnects 630, (iii) the second integrated device 605 to the substrate 602 through the plurality of solder interconnects 632, and (iii) the passive device 607 to the substrate 602 through the plurality of solder interconnects 634. A reflow solder process may be used to couple the integrated devices and passive devices to the substrate. Assembling the integrated devices and/or passive devices may also include encapsulating the integrated device(s) and the passive device(s) with an encapsulation layer (e.g., 610) to form a package.

The method tests (at 2115) the assembled integrated devices and/or passive devices. The method may perform one or more tests on the assembled integrated devices and/or passive devices. If the assembled integrated devices and/or passive devices does not pass the test, the entire assembly may be discarded or recycled. In some implementations, if the assembled integrated devices and/or passive devices does not pass the test, any defective component may be removed and replaced with another component and the test is performed again. If the assembled integrated devices and/or passive devices passes the test(s), the method proceeds to 2120.

The method fabricates and tests (at 2120) one or more antenna devices (e.g., 204, 206, 406, 506). An example of fabricating an antenna device is illustrated and described in FIGS. 18A-18D and FIGS. 19A-19C. If the antenna device does not pass the test, the entire assembly may be discarded or recycled.

The method couples (at 2125) one or more antenna devices (e.g., 204, 206, 406, 506) and at least one package (e.g., 202) to a flexible PCB (e.g., 210, 510). A reflow solder process may be used to couple the antenna device and the package to the flexible PCB.

The method tests (at 2130) the entire device that includes the flexible PCB, the antenna devices, the package, the integrated devices and/or passive devices. The method may perform one or more tests on the entire device. If the entire device does not pass the test, the entire device may be discarded or recycled. In some implementations, if the entire device does not pass the test, any defective component may be removed and replaced with another component and the test is performed again.

In some implementations, the flexible PCB, package and antenna devices may be fabricated and tested separately, and then assembled. For example, the flexible PCB, the packages (comprising the integrated device and substrate), and the antenna devices may be provided by one or more suppliers and then assembled (at 2125) and tested (at 2130). Thus, in some implementations, (at 2125) an integrated device may be coupled to a flexible PCB, a first antenna device may be coupled to the flexible PCB and a second antenna device may be coupled to the flexible PCB.

Exemplary Electronic Devices

Figure 22:
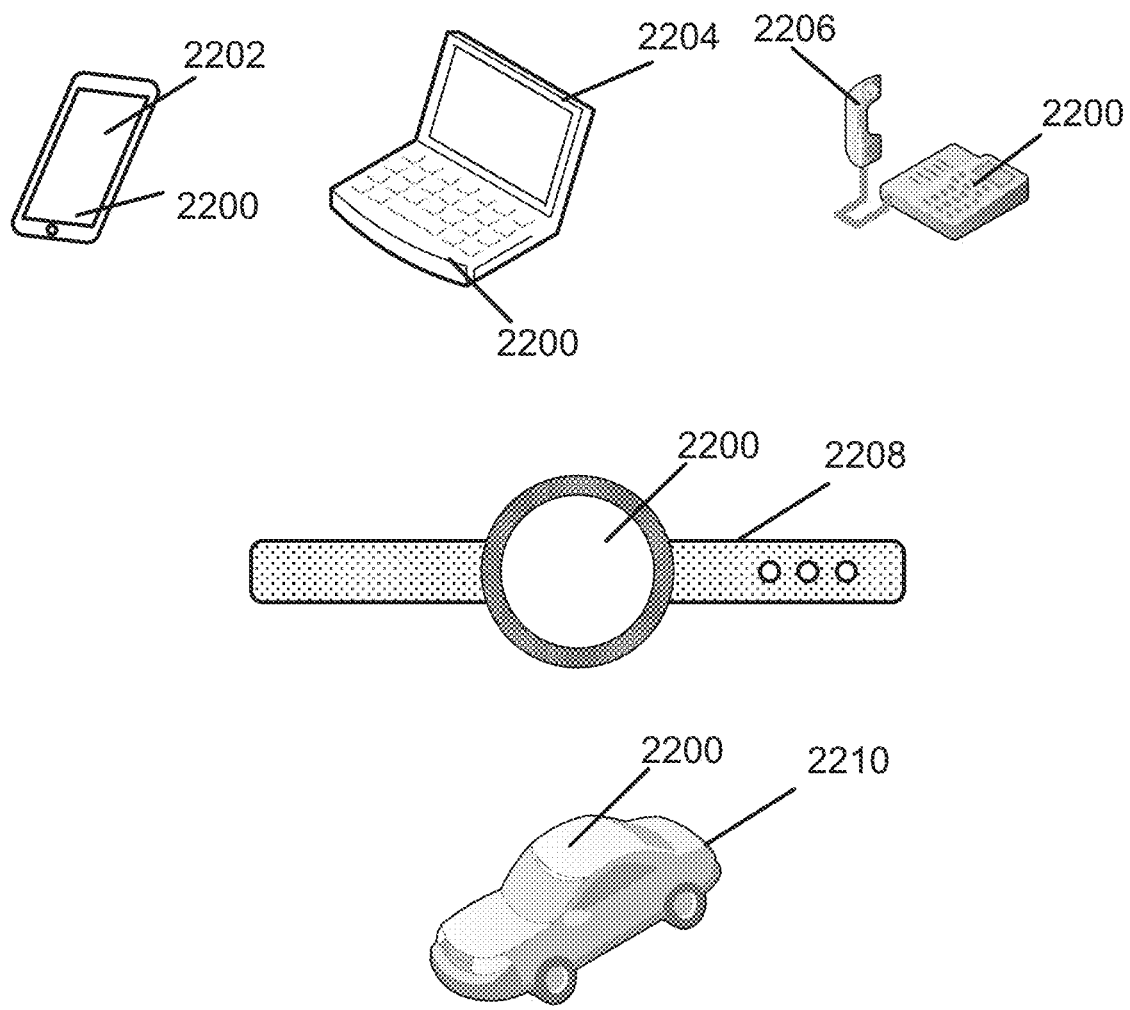
FIG. 22 illustrates various electronic devices that may integrate a die, an integrated device, an integrated passive device (IPD), a passive component, a package, and/or a device package described herein.

FIG. 22 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 2202, a laptop computer device 2204, a fixed location terminal device 2206, a wearable device 2208, or automotive vehicle 2210 may include a device 2200 as described herein. The device 2200 may be, for example, any of the devices and/or integrated circuit (IC) packages described herein. The devices 2202, 2204, 2206 and 2208 and the vehicle 2210 illustrated in FIG. 22 are merely exemplary. Other electronic devices may also feature the device 2200 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-15, 16A-16B, 17, 18A-18C, 19A-19C, and/or 20-22 may be rearranged and/or combined into a single component, process, feature or function or embodied in several components, processes, or functions. Additional elements, components, processes, and/or functions may also be added without departing from the disclosure. It should also be noted FIGS. 2-15, 16A-16B, 17, 18A-18C, 19A-19C, and/or 20-22 and its corresponding description in the present disclosure is not limited to dies and/or ICs. In some implementations, FIGS. 2-15, 16A-16B, 17, 18A-18C, 19A-19C, and/or 20-22 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first, second, third or fourth. For example, a component that is referred to a second component, may be the first component, the second component, the third component or the fourth component. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that may be configured to provide an electrical path for a signal (e.g., a data signal), ground and/or power. An interconnect may be part of a circuit. An interconnect may include more than one element or component. An interconnect may be defined by one or more interconnects. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A device comprising:
 a flexible printed circuit board (PCB);
 a package coupled to a first surface of the flexible PCB;
 a first antenna device coupled to a second surface of the flexible PCB;
 a second antenna device coupled to the second surface of flexible PCB, wherein the first antenna device faces a first direction and the second antenna device faces a second direction that is different than the first direction; and
 a third antenna device coupled to the first surface of the flexible PCB;
 wherein the flexible printed circuit board (PCB) is configurable to be bendable by an angle of 90 degrees such that (i) the third antenna device faces a third direction, and (ii) the package faces a fourth direction that is different from the third direction.

2. The device of claim 1,
 wherein the first antenna device is coupled to the second surface of the flexible PCB through a first plurality of solder interconnects; and
 wherein the second antenna device is coupled to the second surface of the flexible PCB through a second plurality of solder interconnects.

3. The device of claim 2, wherein the third antenna device is coupled to the first surface of the flexible PCB through a third plurality of solder interconnects.

4. The device of claim 1,
 wherein the first antenna device is configured to transmit and receive a first signal having a first frequency, and
 wherein the second antenna device is configured to transmit and receive a second signal having a second frequency.

5. The device of claim 1,
 wherein the first antenna device is configured to transmit and receive signals, and
 wherein the first antenna device comprises:
  at least one dielectric layer; and
  at least one interconnect.

6. The device of claim 1, wherein the flexible PCB comprises:
 at least one flexible interconnect;
 at least one flexible dielectric layer; and
 at least one a solder resist layer coupled to the at least one flexible dielectric layer.

7. The device of claim 1, wherein the flexible PCB comprises:
 at least one flexible interconnect;
 at least one flexible dielectric layer; and
 an overlay located in a flexible portion of the flexible PCB.

8. The device of claim 1, wherein the package comprises:
 a substrate; and
 an integrated device coupled to the substrate.

9. The device of claim 1, wherein the second direction is opposite to the third direction.

10. The device of claim 1, wherein the flexible PCB is configured to be (i) bendable by at least 10 degrees without fracturing and/or cracking, and/or (ii) bendable up to 180 degrees without fracturing and/or cracking.

11. An apparatus comprising:
 means for flexible interconnection;
 a package coupled to a first surface of the means for flexible interconnection;
 a first antenna device coupled to a second surface of the means for flexible interconnection; and
 a second antenna device coupled to the second surface of the means for flexible interconnection, wherein the first antenna device faces a first direction and the second antenna device faces a second direction that is different than the first direction; and
 a third antenna device coupled to the first surface of the means for flexible interconnection;
 wherein the means for flexible interconnection is configurable to be bendable such that (i) the third antenna device faces a third direction, and (ii) the package faces a fourth direction that is at an angle of about 90 degrees relative to the third direction.

12. The apparatus of claim 11,
 wherein the first antenna device is coupled to the second surface of the means for flexible interconnection through a first plurality of solder interconnects; and wherein the second antenna device is coupled to the second surface of the means for flexible interconnection through a first plurality of solder interconnects.

13. The apparatus of claim 12, wherein the third antenna device is coupled to the first surface of the means for flexible interconnection through a third plurality of solder interconnects.

14. The apparatus of claim 11,
wherein the first antenna device is configured to transmit and receive a first signal having a first frequency, and
wherein the second antenna device is configured to transmit and receive a second signal having a second frequency.

15. The apparatus of claim 11,
wherein the first antenna device is configured to transmit and receive signals, and
wherein the first antenna device comprises:
at least one dielectric layer; and
at least one interconnect.

16. The apparatus of claim 11, wherein the means for flexible interconnection comprises:
at least one flexible interconnect;
at least one flexible dielectric layer;
at least one a solder resist layer coupled to the at least one flexible dielectric layer; and
at least one overlay coupled to the at least one flexible dielectric layer.

17. The apparatus of claim 11, wherein the means for flexible interconnection comprises:
at least one flexible interconnect;
at least one flexible dielectric layer; and
an overlay located in a flexible portion of the means for flexible interconnection, wherein the overlay is coupled to the at least one flexible dielectric layer.

18. The apparatus of claim 11, wherein the package comprises:
a substrate; and
an integrated device coupled to the substrate.

19. The apparatus of claim 11, wherein the second direction is opposite to the third direction.

20. The apparatus of claim 11, wherein the apparatus includes a particular device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

21. A method comprising:
coupling a package to a first surface of the flexible printed circuit board (PCB);
coupling a first antenna device to a second surface of the flexible PCB;
coupling a second antenna device to the second surface of the flexible PCB, wherein the first antenna device faces a first direction and the second antenna device faces a second direction that is different than the first direction; and
coupling a third antenna device to the first surface of the flexible PCB, wherein the flexible printed circuit board (PCB) is configurable to be bendable such that (i) the third antenna device faces a third direction, and (ii) the package faces a fourth direction that is at an angle of about 90 degrees relative to the third direction.

22. The method of claim 21,
wherein the first antenna device is coupled to the second surface of the flexible PCB through a first plurality of solder interconnects; and
wherein the second antenna device is coupled to the second surface of the flexible PCB through a second plurality of solder interconnects.

23. The method of claim 22, wherein the third antenna device is coupled to the first surface of the flexible PCB through a third plurality of solder interconnects.

24. The method of claim 21,
wherein the first antenna device is configured to transmit and receive a first signal having a first frequency, and
wherein the second antenna device is configured to transmit and receive a second signal having a second frequency.

25. The method of claim 21, wherein the flexible PCB is configured to be (i) bendable by at least 10 degrees without fracturing and/or cracking, and/or (ii) bendable up to 180 degrees without fracturing and/or cracking.

* * * * *